US011885912B2

(12) United States Patent
Takatsuka et al.

(10) Patent No.: US 11,885,912 B2
(45) Date of Patent: Jan. 30, 2024

(54) SENSOR DEVICE

(71) Applicant: SONY SEMICONDUCTOR SOLUTIONS CORPORATION, Kanagawa (JP)

(72) Inventors: Yusuke Takatsuka, Kanagawa (JP); Yoshiki Ebiko, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/999,868

(22) PCT Filed: Apr. 20, 2021

(86) PCT No.: PCT/JP2021/016040
§ 371 (c)(1),
(2) Date: Nov. 25, 2022

(87) PCT Pub. No.: WO2021/251006
PCT Pub. Date: Dec. 16, 2021

(65) Prior Publication Data
US 2023/0350028 A1 Nov. 2, 2023

(30) Foreign Application Priority Data

Jun. 7, 2020 (JP) .................. 2020-098996

(51) Int. Cl.
*G01S 7/48* (2006.01)
*G01S 7/481* (2006.01)
(Continued)

(52) U.S. Cl.
CPC .......... *G01S 7/4816* (2013.01); *G01S 7/4915* (2013.01); *G01S 17/32* (2013.01)

(58) Field of Classification Search
CPC ...... G01S 7/4816; G01S 7/4915; G01S 17/32; H01L 27/14601; H01L 27/14612; H01L 27/1463
See application file for complete search history.

(56) References Cited

U.S. PATENT DOCUMENTS

2021/0266482 A1* 8/2021 Ammo ................. H04N 25/77
2022/0070396 A1* 3/2022 Amikawa ............ H04N 25/771

FOREIGN PATENT DOCUMENTS

JP 2009-047658 A 3/2009
JP 2010-040594 A 2/2010
(Continued)

OTHER PUBLICATIONS

International Search Report and Written Opinion of PCT Application No. PCT/JP2021/016040, dated Jul. 20, 2021, 10 pages of ISRWO.

*Primary Examiner* — Kevin K Pyo
(74) *Attorney, Agent, or Firm* — CHIP LAW GROUP

(57) ABSTRACT

A sensor device according to the present technology includes a pixel that includes: a photoelectric conversion element that performs photoelectric conversion; a first charge holding unit and a second charge holding unit that hold charges accumulated in the photoelectric conversion element; a first transfer transistor that transfers the charges to the first charge holding unit; and a second transfer transistor that transfers the charges to the second charge holding unit. Each of the first and second transfer transistors includes a vertical transistor including a vertical gate electrode portion, and in each of the first and second transfer transistors, an oxide film thickness of an opposite side wall portion is made larger than an oxide film thickness of a transfer side wall portion, the opposite side wall portion being positioned on a side opposite to the transfer side wall (Continued)

portion that is a wall portion on a side facing a transfer path of the charges among side wall portions of the vertical gate electrode portion.

10 Claims, 14 Drawing Sheets

(51) Int. Cl.
*G01S 17/32* (2020.01)
*G01S 7/4915* (2020.01)

(56) References Cited

FOREIGN PATENT DOCUMENTS

| | | |
|---|---|---|
| JP | 2011-159757 A | 8/2011 |
| JP | 2012-084697 A | 4/2012 |
| JP | 2013-021169 A | 1/2013 |
| JP | 2016-136584 A | 7/2016 |
| JP | 2019-004149 A | 1/2019 |
| JP | 2020-009883 A | 1/2020 |
| WO | 2015/118884 A1 | 8/2015 |

* cited by examiner

FRONT SURFACE STEP

BACK SURFACE STEP

SENSOR DEVICE

CROSS REFERENCE TO RELATED APPLICATIONS

This application is a U.S. National Phase of International Patent Application No PCT/JP2021/016040 filed on Apr. 20, 2021, which claims priority benefit of Japanese Patent Application No. JP 2020-098996 filed in the Japan Patent Office on Jun. 7, 2020. Each of the above-referenced applications is hereby incorporated herein by reference in its entirety.

TECHNICAL FIELD

The present technology relates to a sensor device including a pixel that transfers charges accumulated in a photoelectric conversion element to different charge holding units by two transfer transistors, and particularly relates to a technical field of a sensor device including vertical transistors as the transfer transistors described above.

BACKGROUND ART

As a distance measurement technology, a technology of performing distance measurement by a time of flight (ToF) method has been proposed. As the ToF method, there are a direct ToF method and an indirect ToF method.

In the indirect ToF method, light emitted from a light source is reflected by an object, and reflected light from the object is photoelectrically converted by a photoelectric conversion element such as a photodiode. Then, signal charges obtained by the photoelectric conversion are distributed to two floating diffusions (FD: floating diffusion region) by a pair of transfer transistors that are alternately driven.

As a sensor device that performs distance measurement by the indirect ToF method, there is a sensor device including vertical transistors as transfer transistors for charge distribution as described above (for example, see Patent Document 1 below).

CITATION LIST

Patent Document

Patent Document 1: Japanese Patent Application Laid-Open No. 2020-9883

SUMMARY OF THE INVENTION

Problems to be Solved by the Invention

Here, in a case where a vertical transistor is used as the transfer transistor, the area of a side wall portion of a vertical gate electrode portion tends to be large. Accordingly, the capacitance of the side wall portion increases, which causes a decrease in the response speed of the transfer transistor. A decrease in the response speed of the transfer transistor makes it difficult to perform the charge distribution operation as described above at high speed.

The present technology has been made in view of the above-described circumstances, and it is an object of the present technology to enable high-speed switching operation of the transfer transistors, and to increase the speed of a charge distribution operation.

Solutions to Problems

A sensor device according to the present technology is a sensor device including a pixel that includes: a photoelectric conversion element that performs photoelectric conversion; a first charge holding unit and a second charge holding unit that hold charges accumulated in the photoelectric conversion element; a first transfer transistor that transfers the charges to the first charge holding unit; and a second transfer transistor that transfers the charges to the second charge holding unit, in which each of the first and second transfer transistors includes a vertical transistor including a vertical gate electrode portion, and in each of the first and second transfer transistors, an oxide film thickness of an opposite side wall portion is made larger than an oxide film thickness of a transfer side wall portion, the opposite side wall portion being positioned on a side opposite to the transfer side wall portion that is a wall portion on a side facing a transfer path of the charges among side wall portions of the vertical gate electrode portion.

In the transfer transistor using the vertical transistor, the oxide film thickness of the opposite side wall portion is made larger than the oxide film thickness of the transfer side wall portion as described above. Accordingly, it is possible to reduce the side wall capacitance of the vertical gate electrode portion by increasing the oxide film thickness of the opposite side wall portion while making the thickness of the gate oxide film of the transfer side wall portion contributing to charge transfer a film thickness suitable for charge transfer.

In the sensor device according to the present technology described above, a configuration is conceivable in which the sensor device further includes a plurality of pixels each being the pixel, and at least a portion of an oxide film of the opposite side wall portion is also used as an oxide film for inter-pixel separation.

Therefore, an oxide film forming step of the opposite side wall portion can be merged with an oxide film forming step for inter-pixel separation.

In the sensor device according to the present technology described above, a configuration is conceivable in which at least a portion of the oxide film of the opposite side wall portion is also used as a shallow trench isolation.

Therefore, the oxide film forming step of the opposite side wall portion can be merged with a step of forming the shallow trench isolation for inter-pixel separation.

In the sensor device according to the present technology described above, a configuration is conceivable in which the first and second transfer transistors are arranged at corner portions having a diagonal relationship in the pixel of a rectangular shape.

Therefore, it is possible to realize a structure in which the oxide film thickness of the opposite side wall portion is made larger than that of the transfer side wall portion by a simple method in which the width of an intersecting portion of the shallow trench isolation is made larger.

In the sensor device according to the present technology described above, a configuration is conceivable in which the sensor device further includes a front full trench isolation as a structure for inter-pixel separation, and each of the shallow trench isolation and the front full trench isolation has a width at an intersection portion made larger than other portions.

By increasing the width of the intersection portion not only of the shallow trench isolation but also of the front full trench isolation, the frame strength (frame rigidity) of the pixel array unit is improved.

In the sensor device according to the present technology described above, a configuration is conceivable in which the first and second transfer transistors each include two vertical gate electrode portions each being the vertical gate electrode portion, and transfer the charges via a region between the two vertical gate electrode portions.

By adopting a structure in which the charges are transferred via the region between the two vertical gate electrode portions, charge transfer efficiency is improved.

In the sensor device according to the present technology described above, a configuration is conceivable in which, in the first and second transfer transistors, the opposite side wall portion has a step shape in which a distal end portion is offset toward a transfer side wall portion side.

Therefore, it is possible to increase the oxide film thickness of the opposite side wall portion while preventing the oxide film thickness of the transfer side wall portion from increasing in a step of forming the vertical transistor.

In the sensor device according to the present technology described above, it is conceivable that the sensor device further includes: a plurality of pixels each being the pixel; and a shallow trench isolation and a front full trench isolation as structures for inter-pixel separation, and the front full trench isolation includes polysilicon.

Therefore, in a process of forming the front full trench isolation, a step of removing polysilicon filled in a trench and a step of filling another material in the trench after removal of polysilicon can be made unnecessary.

In the sensor device according to the present technology described above, it is conceivable that the shallow trench isolation includes a low-k material.

Therefore, at least a portion of the oxide film of the opposite side wall portion includes the low-k material.

In the sensor device according to the present technology described above, a configuration is conceivable in which the sensor device further includes: a plurality of pixels each being the pixel; and a reversed deep trench isolation as a structure for inter-pixel separation.

Therefore, the side wall capacitance of the vertical gate electrode portion is reduced for supporting a case where the reversed deep trench isolation is adopted as a structure for inter-pixel separation.

MODE FOR CARRYING OUT THE INVENTION

Hereinafter, embodiments according to the present technology will be described in the following order with reference to the accompanying drawings.
<1. First Embodiment>
[1-1. Configuration of distance measuring device]
[1-2. Circuit configuration of sensor unit]
[1-3. Circuit configuration of pixel array unit]
[1-4. Pixel structure as first embodiment]
<2. Second Embodiment>
<3. Third Embodiment>
<4. Modifications>
[4-1. First example]
[4-2. Second example]
[4-3. Other modifications]
<5. Summary of embodiments>
<6. Present technology>

1. First Embodiment

[1-1. Configuration of distance measuring device]

Figure 1:
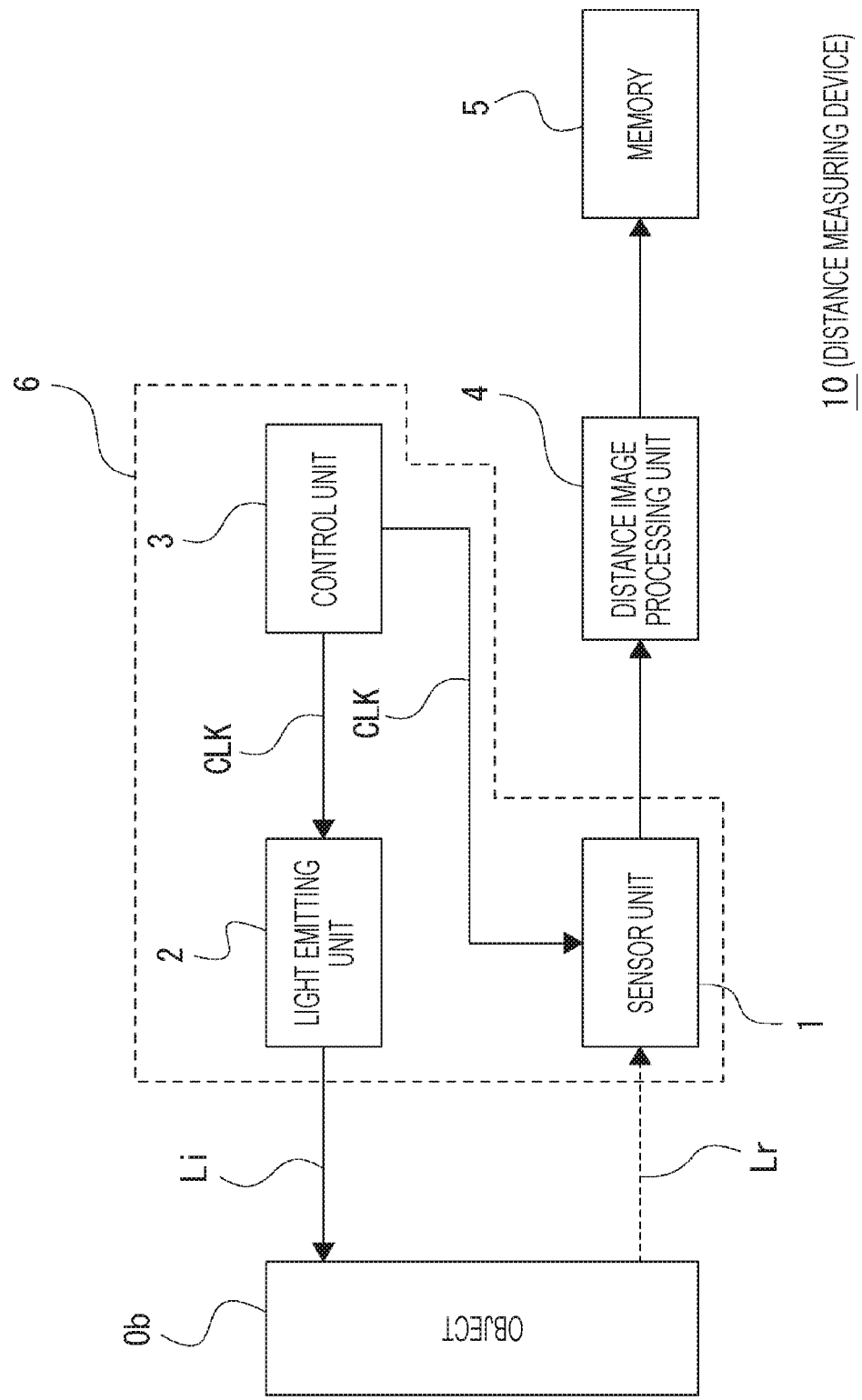
FIG. 1 is a block diagram for describing a configuration example of a distance measuring device including a sensor device as a first embodiment according to the present technology.

FIG. 1 is a block diagram for describing a configuration example of a distance measuring device 10 including a sensor device as a first embodiment according to the present technology.

The distance measuring device 10 includes a sensor unit 1 corresponding to the sensor device as the first embodiment, a light emitting unit 2, a control unit 3, a distance image processing unit 4, and a memory 5. In the present example, the sensor unit 1, the light emitting unit 2, and the control unit 3 are formed on the same substrate, and are configured as a sensing module 6.

The distance measuring device 10 is a device that performs distance measurement by a time of flight (ToF) method. Specifically, the distance measuring device 10 of the present example performs distance measurement by an indirect ToF method. The indirect ToF method is a distance measurement method that calculates a distance to an object Ob on the basis of a phase difference between irradiation light Li to the object Ob and reflected light Lr obtained by reflecting the irradiation light Li by the object Ob.

The light emitting unit 2 includes one or a plurality of light emitting elements as a light source, and emits irradiation light Li to the object Ob. In the present example, the light emitting unit 2 emits, as the irradiation light Li, infrared light having a wavelength in a range of from 780 nm to 1000 nm, for example.

The control unit 3 controls a light emission operation of the irradiation light Li by the light emitting unit 2. In the case of the indirect ToF method, light, the intensity of which is modulated so that the intensity changes at a predetermined cycle, is used as the irradiation light Li. Specifically, in the present example, pulsed light is repeatedly emitted at a predetermined cycle as the irradiation light Li. Hereinafter, such a light emission cycle of the pulsed light is referred to as a "light emission cycle Cl". Furthermore, a period between light emission start timings of the pulsed light when the pulsed light is repeatedly emitted at the light emission cycle Cl is referred to as a "one modulation period Pm", or simply a "modulation period Pm".

The control unit 3 controls the light emission operation of the light emitting unit 2 so that the irradiation light Li is emitted only during a predetermined light emission period in every modulation period Pm.

Here, in the indirect ToF method, the light emission cycle Cl is set to a relatively high speed, for example, about tens of MHz to hundreds of MHz.

The sensor unit 1 receives the reflected light Lr, and outputs distance measurement information by the indirect ToF method on the basis of the phase difference between the reflected light Lr and the irradiation light Li.

As will be described later, the sensor unit 1 of the present example includes a pixel array unit 11 in which a plurality of pixels Px, each of which includes a photoelectric conversion element (photodiode PD in the present example) and a first transfer gate element (transfer transistor TG-A) and a second transfer gate element (transfer transistor TG-B) for transferring accumulated charges in the photoelectric conversion element, is two-dimensionally arrayed, and obtains distance measurement information by the indirect ToF method for every pixel Px.

Note that, hereinafter, information indicating such distance measurement information (distance information) for every pixel Px is referred to as a "distance image".

Here, as is well known, in the indirect ToF method, signal charges accumulated in the photoelectric conversion element in the pixel Px are distributed to two floating diffusions (FD: floating diffusion region) by the first transfer gate element and the second transfer gate element that are alternately turned on. At this time, the cycle in which the first transfer gate element and the second transfer gate element are alternately turned on is the same cycle as the light emission cycle Cl of the light emitting unit 2. That is, the first transfer gate element and the second transfer gate element are each set to be on once in every modulation period Pm, and the distribution of the signal charges to the two floating diffusions as described above is repeatedly performed for every modulation period Pm.

In the present example, the transfer transistor TG-A as the first transfer gate element is set to be on during a light emission period of the irradiation light Li in the modulation period Pm, and the transfer transistor TG-B as the second transfer gate element is set to be on during a non-light emission period of the irradiation light Li in the modulation period Pm.

As described above, since the light emission cycle Cl is set to a relatively high speed, a relatively small amount of signal charges is accumulated in each floating diffusion by one distribution using the first and second transfer gate elements as described above. For this reason, in the indirect ToF method, emission of the irradiation light Li is repeated about thousands to tens of thousands of times per distance measurement (that is, in obtaining a piece of distance image), and in the sensor unit 1, distribution of signal charges to each floating diffusion is repeatedly performed by using the first and second transfer gate elements as described above while the irradiation light Li is repeatedly emitted in this manner.

As understood from the above description, in the sensor unit 1, the first transfer gate element and the second transfer gate element are driven at a timing synchronized with the light emission cycle of the irradiation light Li for every pixel Px. For this synchronization, the control unit 3 controls a light receiving operation by the sensor unit 1 and a light emission operation by the light emitting unit 2 on the basis of a common clock CLK.

The distance image processing unit 4 inputs the distance image obtained by the sensor unit 1, performs predetermined signal processing such as compression encoding, for example, and outputs the distance image to the memory 5.

The memory 5 is a storage device such as a flash memory, a solid state drive (SSD), or a hard disk drive (HDD), for example, and stores the distance image processed by the distance image processing unit 4.

<2. Circuit Configuration of Sensor Unit>

Figure 2:
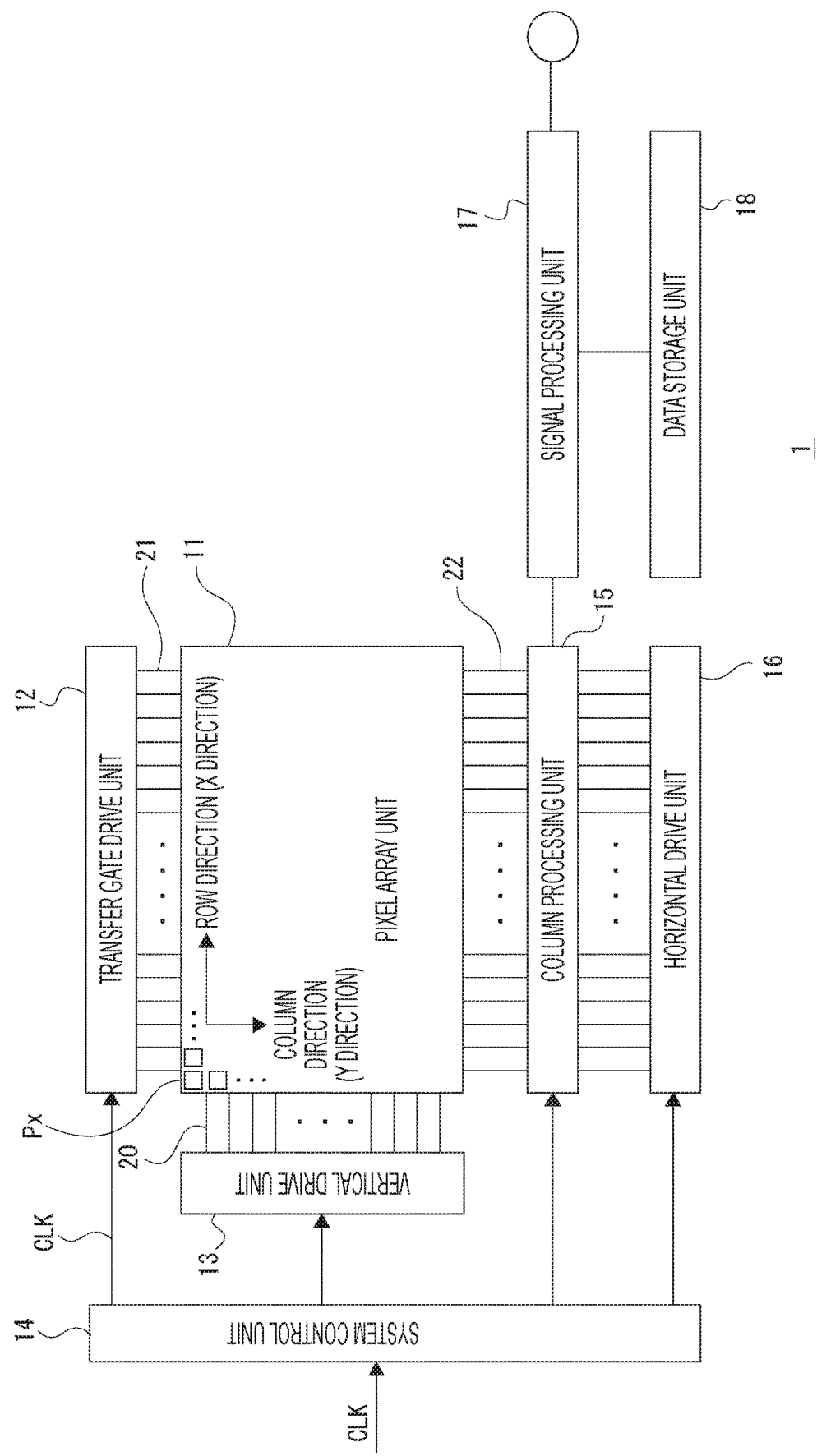
FIG. 2 is a block diagram illustrating an internal circuit configuration example of the sensor device in an embodiment.

FIG. 2 is a block diagram illustrating an internal circuit configuration example of the sensor unit 1.

As illustrated in the drawing, the sensor unit 1 includes the pixel array unit 11, a transfer gate drive unit 12, a vertical drive unit 13, a system control unit 14, a column processing unit 15, a horizontal drive unit 16, a signal processing unit 17, and a data storage unit 18.

The pixel array unit 11 has a configuration in which the plurality of pixels Px is two-dimensionally arrayed in a matrix in a row direction and a column direction. Each pixel Px includes the photodiode PD, which will be described later, as the photoelectric conversion element. Note that details of the circuit configuration of the pixel Px will be described again with reference to FIG. 3.

Here, the row direction refers to an array direction of pixels Px in a horizontal direction, and the column direction refers to an array direction of pixels Px in a vertical direction. In the drawing, the row direction is a lateral direction, and the column direction is a longitudinal direction.

Here, hereinafter, the row direction is referred to as an "X direction", and the column direction is referred to as a "Y direction". Furthermore, a direction orthogonal to an X-Y plane (that is, a thickness direction of the sensor unit 1) is referred to as a "Z direction".

In the pixel array unit 11, with respect to the pixel array in a matrix, a row drive line 20 is wired in the row direction for every pixel row, and two gate drive lines 21 and two vertical signal lines 22 are each wired in the column direction for every pixel column. For example, the row drive line 20 transmits a drive signal for performing driving when signals are read out from the pixels Px. Note that, in FIG. 2, the row drive line 20 is illustrated as one wiring line, but is not limited to one. One end of the row drive line 20 is connected to an output terminal corresponding to each row of the vertical drive unit 13.

The system control unit 14 includes a timing generator that generates various types of timing signals and the like, and performs drive control of the transfer gate drive unit 12, the vertical drive unit 13, the column processing unit 15, the horizontal drive unit 16, and the like on the basis of the various types of timing signals generated by the timing generator.

The transfer gate drive unit 12 drives two transfer gate elements provided for every pixel Px through two gate drive lines 21 provided in each pixel column as described above, on the basis of the control by the system control unit 14.

As described above, the two transfer gate elements are alternately turned on in every modulation period Pm. For this reason, the system control unit 14 supplies the CLK input from the control unit 3 illustrated in FIG. 1 to the transfer gate drive unit 12, and the transfer gate drive unit 12 drives the two transfer gate elements on the basis of the clock CLK.

The vertical drive unit 13 includes a shift register, an address decoder, and the like, and drives the pixels Px in the pixel array unit 11 at the same time for all the pixels, in units of rows, or the like. That is, the vertical drive unit 13 constitutes a drive unit that controls an operation of each pixel Px in the pixel array unit 11 together with the system control unit 14 that controls the vertical drive unit 13.

Detection signals output (read out) from each pixel Px in the pixel row according to the drive control by the vertical drive unit 13, specifically, signals according to the signal charges accumulated in the two respective floating diffusions provided in every pixel Px are input to the column processing unit 15 through the corresponding vertical signal lines 22. The column processing unit 15 performs predetermined signal processing on the detection signals read out through the vertical signal lines 22 from each pixel Px, and temporarily holds the detection signals after signal processing. Specifically, the column processing unit 15 performs noise removal processing, analog to digital (A/D) conversion processing, and the like as signal processing.

Here, readout of two detection signals (detection signals of every floating diffusion) from each pixel Px is performed once for every predetermined number of times of repeated light emission of the irradiation light Li (every thousands to tens of thousands of times of repeated light emission described above).

Therefore, the system control unit 14 controls the vertical drive unit 13 on the basis of the clock CLK so that the readout timing of the detection signals from each pixel Px is controlled to be a timing for every predetermined number of times of repeated light emission of the irradiation light Li in this manner.

The horizontal drive unit 16 includes a shift register, an address decoder, and the like, and sequentially selects unit circuits corresponding to the pixel columns of the column processing unit 15. By the selective scanning by the horizontal drive unit 16, detection signals subjected to the signal processing for every unit circuit in the column processing unit 15 are sequentially output.

The signal processing unit 17 has at least an arithmetic processing function, and performs various types of signal processing such as distance calculation processing employing the indirect ToF method on the basis of the detection signals output from the column processing unit 15. Note that a known method can be used as a method for calculating distance information by the indirect ToF method on the basis of two kinds of detection signals (detection signals of every floating diffusion) for every pixel Px, and the description thereof will be omitted here.

In signal processing in the signal processing unit 17, the data storage unit 18 temporarily stores data necessary for the processing.

The sensor unit 1 configured as described above outputs a distance image indicating the distance to the object Ob for every pixel Px. The distance measuring device 10 including such a sensor unit 1 can be applied to, for example, an in-vehicle system that is mounted on a vehicle and measures a distance to an object Ob outside the vehicle, a device for gesture recognition that measures a distance to an object such as a hand of a user, and recognizes a gesture of the user on the basis of the measurement result, and the like.

<3. Circuit Configuration of Pixel Array Unit>

Figure 3:
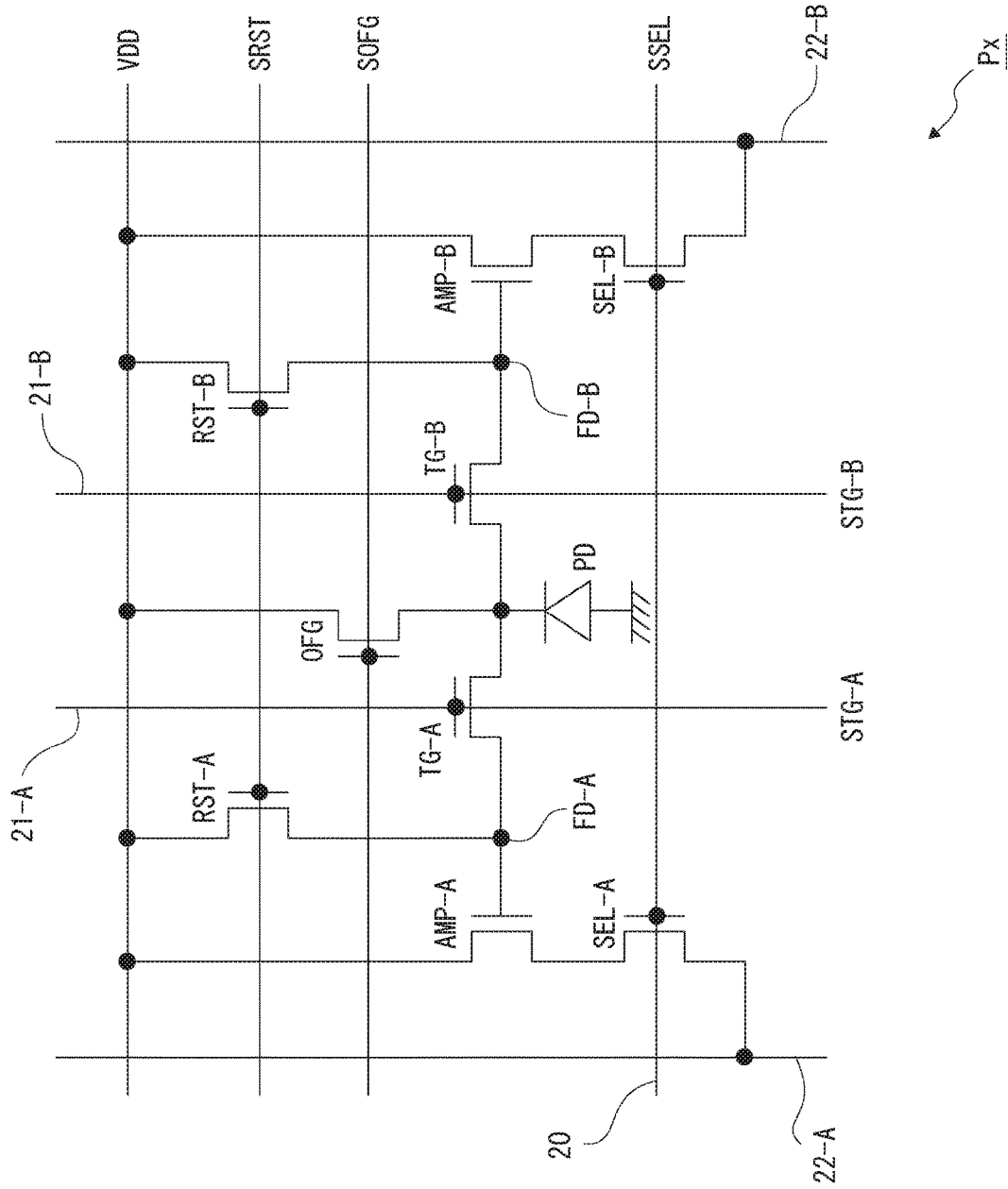
FIG. 3 is an equivalent circuit diagram of a pixel included in the sensor device in the embodiment.

FIG. 3 illustrates an equivalent circuit of the pixel Px two-dimensionally arrayed in the pixel array unit 11.

The pixel Px includes one photodiode PD as a photoelectric conversion element and one overflow (OF) gate transistor OFG. Furthermore, the pixel Px includes two transfer transistors TG as the transfer gate elements, two floating diffusions FD, two reset transistors RST, two amplification transistors AMP, and two selection transistors SEL.

Here, in a case of distinguishing the two transfer transistors TG, the two floating diffusions FD, the two reset transistors RST, the two amplification transistors AMP, and the two selection transistors SEL, all of which are provided in the Pixel Px, as illustrated in FIG. 3, they are referred to as transfer transistors TG-A and TG-B, floating diffusions FD-A and FD-B, reset transistors RST-A and RST-B, amplification transistors AMP-A and AMP-B, and selection transistors SEL-A and SEL-B, respectively.

The OF gate transistor OFG, the transfer transistors TG, the reset transistors RST, the amplification transistors AMP, and the selection transistors SEL include, for example, N-type MOS transistors.

In particular, in the present example, the two transfer transistors TG include vertical transistors having vertical gate electrode portions, which will be described later again.

The OF gate transistor OFG becomes a conductive state when an OF gate signal SOFG supplied to the gate thereof is turned on. The photodiode PD is clamped to a predetermined reference potential VDD and accumulated charges therein are reset when the OF gate transistor OFG becomes a conductive state.

Note that the OF gate signal SOFG is supplied from, for example, the vertical drive unit 13.

The transfer transistor TG-A becomes a conductive state when a transfer drive signal STG-A supplied to the gate thereof is turned on, and transfers signal charges accumulated in the photodiode PD to the floating diffusion FD-A. The transfer transistor TG-B becomes a conductive state when a transfer drive signal STG-B supplied to the gate thereof is turned on, and transfers charges accumulated in the photodiode PD to the floating diffusion FD-B.

The transfer drive signals STG-A and STG-B are supplied from the transfer gate drive unit 12 through gate drive lines 21-A and 21-B each provided as one of the gate drive lines 21 illustrated in FIG. 2.

The floating diffusions FD-A and FD-B are charge holding units that temporarily hold charges transferred from the photodiode PD.

The reset transistor RST-A becomes a conductive state when a reset signal SRST supplied to the gate thereof is set to be on, and resets the potential of the floating diffusion FD-A to the reference potential VDD. Similarly, the reset transistor RST-B becomes a conductive state when the reset signal SRST supplied to the gate thereof is turned on, and resets the potential of the floating diffusion FD-B to the reference potential VDD.

Note that the reset signal SRST is supplied from, for example, the vertical drive unit 13.

The amplification transistor AMP-A constitutes a source follower circuit such that the source thereof is connected to the vertical signal line 22-A via the selection transistor SEL-A, and the drain thereof is connected to the reference potential VDD (constant current source). The amplification transistor AMP-B constitutes a source follower circuit such that the source thereof is connected to the vertical signal line 22-B via the selection transistor SEL-B, and the drain thereof is connected to the reference potential VDD (constant current source).

Here, the vertical signal lines 22-A and 22-B are each provided as one of the vertical signal lines 22 illustrated in FIG. 2.

The selection transistor SEL-A is connected between the source of the amplification transistor AMP-A and the vertical signal line 22-A, becomes a conductive state when a selection signal SSEL supplied to the gate thereof is set to be on, and outputs charges held in the floating diffusion FD-A to the vertical signal line 22-A via the amplification transistor AMP-A.

The selection transistor SEL-B is connected between the source of the amplification transistor AMP-B and the vertical signal line 22-B, becomes a conductive state when the selection signal SSEL supplied to the gate thereof is set to be on, and outputs charges held in the floating diffusion FD-B to the vertical signal line 22-B via the amplification transistor AMP-A.

Note that the selection signal SSEL is supplied from the vertical drive unit 13 through the row drive line 20.

An operation of the pixel Px will be briefly described.

First, before light reception is started, a reset operation for resetting charges in the pixel Px is performed in all the pixels. That is, for example, the OF gate transistor OFG, each reset transistor RST, and each transfer transistor TG are set to be on (conductive state), and accumulated charges in the photodiode PD and each floating diffusion FD are reset.

After resetting the accumulated charges, a light receiving operation for distance measurement is started in all the pixels. The term light receiving operation here means a light receiving operation performed for one distance measurement. That is, during the light receiving operation, an operation in which the transfer transistors TG-A and TG-B are alternately turned on is repeated a predetermined number of times (in the present example, about thousands to tens of thousands of times). Hereinafter, such a period of the light receiving operation performed for one distance measurement is referred to as a "light receiving period Pr".

In the light receiving period Pr, in one modulation period Pm of the light emitting unit 2, for example, a period in which the transfer transistor TG-A is on (that is, a period in which the transfer transistor TG-B is off) is continued over a light emission period of the irradiation light Li, thereafter, a remaining period, that is, a non-light emission period of the irradiation light Li is a period in which the transfer transistor TG-B is on (that is, a period in which the transfer transistor TG-A is off). That is, in the light receiving period Pr, an operation in which charges in the photodiode PD are distributed to the floating diffusions FD-A and FD-B in one modulation period Pm are repeated a predetermined number of times.

Then, each of the pixels Px in the pixel array unit 11 is line sequentially selected when the light receiving period Pr ends. In the selected pixel Px, the selection transistors SEL-A and SEL-B are turned on. Therefore, the charges accumulated in the floating diffusion FD-A are output to the column processing unit 15 through the vertical signal line 22-A. Furthermore, the charges accumulated in the floating diffusion FD-B are output to the column processing unit 15 through the vertical signal line 22-B.

As described above, one light receiving operation ends, and the next light receiving operation starting from the reset operation is executed.

Here, reflected light received by the pixel Px is delayed according to the distance to the object Ob from the timing at which the light emitting unit 2 emits the irradiation light Li. The distribution ratio of the charges accumulated in the two floating diffusions FD-A and FD-B is changed depending on the delay time according to the distance to the object Ob. Accordingly, the distance to the object Ob can be obtained from the distribution ratio of the charges accumulated in these two floating diffusions FD-1 and FD-B.

[1-4. Pixel Structure as First Embodiment]

Figure 4:
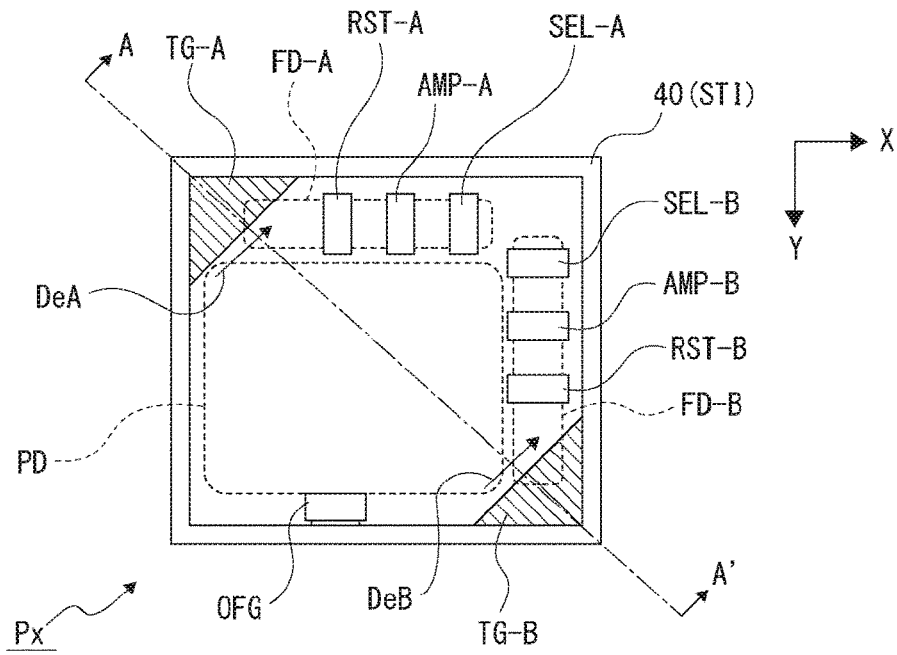
FIG. 4 is a plan view for describing a schematic structure of a pixel as the first embodiment.
Figure 5:
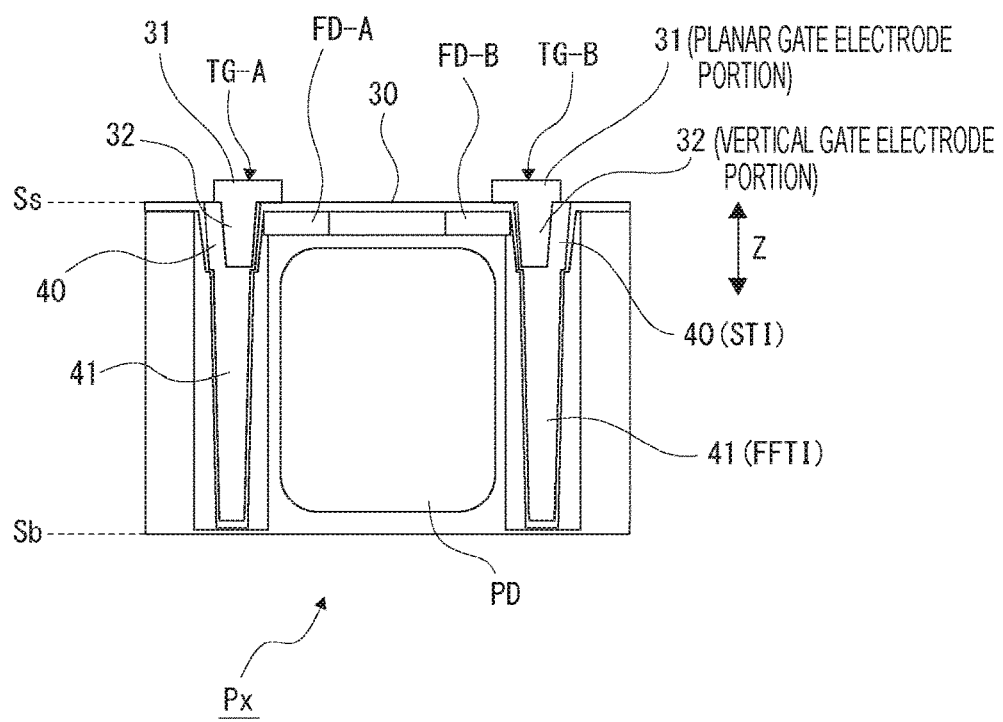
FIG. 5 is a cross-sectional view for describing a schematic structure of the pixel as the first embodiment.

FIGS. 4 and 5 are views for describing a schematic structure of the pixel Px.

FIG. 4 is a plan view of the pixel Px observed from a front surface Ss side of a semiconductor substrate (for example, a silicon substrate) on which the pixel Px is formed. FIG. 5 is a cross-sectional view illustrating a state of a cross section when the pixel Px is cut at a position of line A-A' illustrated in FIG. 4 in the Z direction (thickness direction of the sensor unit 1).

Here, in the present example, the sensor unit 1 is configured as a so-called backside illumination sensor device, and a wiring layer (not illustrated) is stacked on the front surface Ss side of the semiconductor substrate on which the pixel Px is formed, and a back surface Sb side of the semiconductor substrate is an incident surface side of light. In the above-described wiring layer, various types of wiring lines for driving the pixel such as wiring lines for driving various types of transistors in the pixel Px such as the transfer transistors TG and the like are formed.

Note that an on-chip microlens and the like are formed on the back surface Sb side of the pixel Px, but here, with respect to the structure of the pixel Px, only portions relating to the present technology are extracted and illustrated, and illustration of other portions is omitted.

The pixel Px has a rectangular shape in a plan view illustrated in FIG. 4.

The photodiode PD is arranged substantially at the center of the pixel Px in the semiconductor substrate. The photodiode PD has a substantially rectangular shape in a plan view and a cross-sectional view illustrated in FIG. 5.

The transfer transistors TG-A and TG-B are formed such that portions thereof are exposed on the front surface Ss of the semiconductor substrate, and arranged at corner portions having a diagonal relationship in the pixel Px in a plan view illustrated in FIG. 4. In the present example, the transfer transistors TG-A and TG-B have a substantially right triangle shape in a plan view, and are arranged so that the right angle corner portions match the respective corresponding corner portions of the pixel Px.

The floating diffusions FD-A and FD-B are each formed at a position close to the front surface Ss in the semiconductor substrate. The reset transistors RST-A and RST-B, the amplification transistors AMP-A and AMP-B, the selection transistors SEL-A and SEL-B, and the OF gate transistor OFG are formed on the front surface Ss of the semiconductor substrate.

In the present example, the floating diffusions FD-A and FD-B are each formed in a substantially elongated rectangular shape in a plan view, and positioned on the outer peripheral side of the pixel Px with respect to the photodiode PD in a plan view.

The floating diffusion FD-A, one end portion of which overlaps with the formation region of the transfer transistor TG-A in a plan view, extends in a direction away from the transfer transistor TG-A in the X direction. The floating diffusion FD-B, one end portion of which overlaps with the formation region of the transfer transistor TG-B in a plan view, extends in a direction away from the transfer transistor TG-B in the Y direction.

The reset transistor RST-A, the amplification transistor AMP-A, and the selection transistor SEL-A are arranged in this order in the direction away from the transfer transistor TG-A in the X direction, and the reset transistor RST-B, the amplification transistor AMP-B, and the selection transistor SEL-B are arranged in this order in the direction away from the transfer transistor TG-B in the Y direction.

The OF gate transistor OFG is arranged on an outer peripheral portion of any of four sides of the photodiode PD in a plan view, excluding a side where the reset transistor RST-A, the amplification transistor AMP-A, and the selection transistor SEL-A are arrayed and a side where the reset transistor RST-B, the amplification transistor AMP-B, and the selection transistor SEL-B are arrayed. Specifically, in the present example, the OF gate transistor OFG is arranged on the outer peripheral portion of a side opposite to the side where the reset transistor RST-A, the amplification transistor AMP-A, and the selection transistor SEL-A are arrayed among the above-described four sides of the photodiode PD.

In a plan view in FIG. 4, a shallow trench isolation (STI) 40 for inter-pixel separation is formed on an outer edge portion of the pixel Px. The STI 40 includes an oxide film such as silicon dioxide ($SiO_2$), for example, and has a function of suppressing a leakage current between adjacent pixels Px.

Furthermore, as illustrated in FIG. 5, a front full trench isolation (FFTI) 41 for inter-pixel separation is formed on a lower portion of the STI 40. The FFTI 41 includes, for example, an oxide film such as $SiO_2$, and is formed from the STI 40 up to the position near the back surface Sb as illustrated in FIG. 5. The FFTI 41 has, in a backside illumination type, that is, in a case where the back surface Sb is the light incident surface, a function of preventing light to be incident on each pixel Px from leaking into adjacent pixels (optical prevention function) and a function of preventing electrons after photoelectric conversion by the photodiode PD from leaking into adjacent pixels (electrical prevention function).

Here, in the present example, the transfer transistors TG-A and TG-B are configured as vertical transistors. Specifically, the transfer transistors TG-A and TG-B each include a planar gate electrode portion 31 formed on the front surface Ss of the semiconductor substrate, and a vertical gate electrode portion 32 extending from the planar gate electrode portion 31 toward the back surface Sb side in the Z direction.

In FIG. 4, arrows DeA and DeB schematically indicate transfer paths of charges from the photodiode PD to the floating diffusions FD-A and FD-B by the transfer transistors TG-A and TG-B, respectively. Hereinafter, the transfer paths of the charges by the transfer transistors TG-A and TG-B indicated by these arrows DeA and DeB are referred to as a "charge transfer path DeA" and a "charge transfer path DeB", respectively.

As illustrated in FIG. 4, the charge transfer paths DeA and DeB in the present example are paths along a side facing the photodiode PD among three sides of the transfer transistors TG-A and TG-B, respectively.

Figure 6:
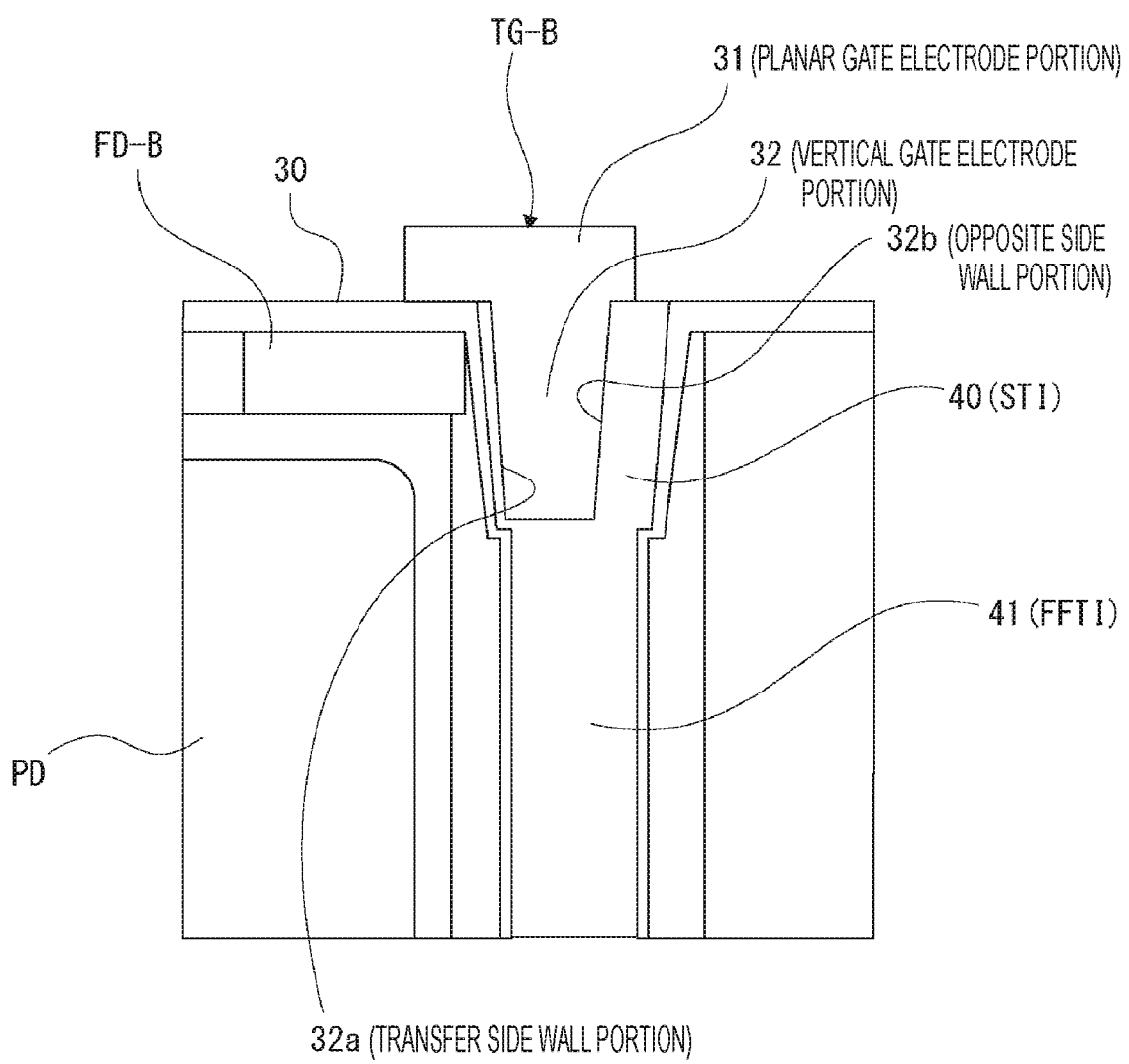
FIG. 6 is an enlarged view illustrating a portion of a cross-sectional structure illustrated in FIG. 5 in an enlarged manner.

FIG. 6 illustrates a vicinity of a portion where the transfer transistor TG-B is formed in the cross-sectional structure illustrated in FIG. 5 in an enlarged manner.

According to the charge transfer path DeB illustrated in FIG. 4, in the vertical gate electrode portion 32 of the transfer transistor TG-B, a side wall portion on a side facing the photodiode PD is a side wall portion on a side contributing to charge transfer. With respect to side wall portions of the vertical gate electrode portion 32, the side wall portion on the side contributing to the charge transfer in this manner, in other words, a side wall portion on a side facing the charge transfer path DeB is referred to as a "transfer side wall portion 32a" as illustrated in the drawing.

Furthermore, with respect to the side wall portions of the vertical gate electrode portion 32, a wall portion on a side opposite to the transfer side wall portion 32a is a wall portion that does not contribute to, or hardly contributes to charge transfer, and is hereinafter referred to as an "opposite side wall portion 32b".

Note that, although illustration is omitted, also with respect to the transfer transistor TG-A side, a transfer side wall portion 32a of the vertical gate electrode portion 32 is a side wall portion on a side contributing to charge transfer, that is, a side wall portion on a side facing the charge transfer path DeA.

Here, in the vertical transistor, the area of the side wall portion of the vertical gate electrode portion 32 tends to be large. Accordingly, the capacitance of the side wall portion increases, which causes a decrease in the response speed of the transfer transistor TG.

In the vertical transistor, when the dielectric constant of the gate oxide film of the vertical gate electrode portion 32 is denoted by s, the area thereof is denoted by S, and the thickness thereof is denoted by d, a capacitance C of the side wall portion of the vertical gate electrode portion 32 is expressed by the following equation.

$$C = \varepsilon S/d \qquad \text{[Equation 1]}$$

Here, in the vertical gate electrode portion 32, the thickness d of the gate oxide film of the transfer side wall portion 32a should be set to a thickness suitable for the charge transfer. On the other hand, since it can be considered that the opposite side wall portion 32b does not contribute to the charge transfer, it can be said that it is not necessary to provide a constraint as provided to the transfer side wall portion 32a with respect to the thickness d of the oxide film.

Therefore, in the present embodiment, with respect to the vertical gate electrode portion 32, the oxide film thickness of the opposite side wall portion 32b is made larger than the oxide film thickness of the transfer side wall portion 32a.

In this manner, it can be understood from [Equation 1] that the capacitance C can be reduced by increasing the oxide film thickness.

By reducing the side wall capacitance of the vertical gate electrode portion 32 as the capacitance C, a high-speed switching operation of the transfer transistors TG becomes possible, so that it is possible to increase the speed of the charge distribution operation.

Furthermore, by the reduction of the capacitance C, a potential can be applied to a deep portion. Accordingly, it is possible to reduce the drive voltage of the transfer transistors TG, so that power of the sensor unit 1 can be saved.

Here, in the present example, at least a portion of the oxide film of the opposite side wall portion 32b is also used as the oxide film of the STI 40.

Therefore, an oxide film forming step of the opposite side wall portion 32b can be merged with an oxide film forming step for inter-pixel separation.

The outline of steps of forming the STI 40 and the FFTI 41 will be described with reference to FIGS. 7A, 7B, 7C, 7D, 7E, 7F, 8A, 8B, 8C, and 8D.

FIGS. 7A, 7B, 7C, 7D, 7E, and 7F are explanatory views of a front surface step. The front surface step is a step in which the semiconductor substrate is subjected to working from the front surface side of the semiconductor substrate on which the pixel Px is formed.

Figure 7A:
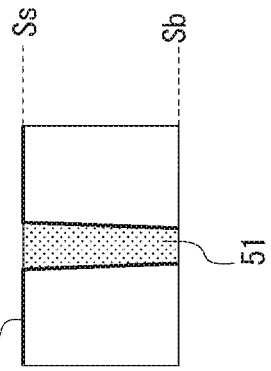
FIGS. 7A, 7B, 7C, 7D, 7E, and 7F are views for describing an outline of a front surface step among steps of forming an STI and an FFTI.

First, as illustrated in FIG. 7A, a trench (groove) T1 for forming the FFTI 41 is formed by cutting the semiconductor substrate from the front surface Ss side. Since the trench T1 is a trench for the FFTI, the trench T1 is formed to penetrate from the front surface Ss to the back surface Sb.

Figure 7B:
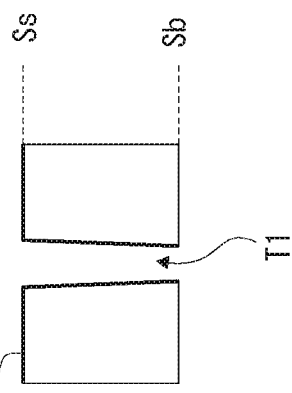

Next, the semiconductor substrate after forming the trench T1 is subjected to heat treatment to form an oxide film (thermal oxide film) 50 (FIG. 7B). The oxide film 50 functions as, for example, an insulating film 30 described above.

Figure 7C:
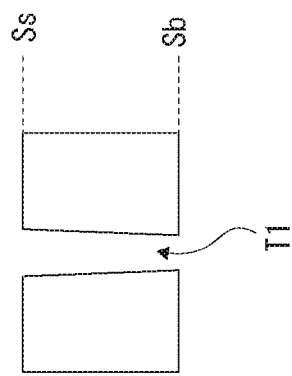

Following the step in FIG. 7B, as illustrated in FIG. 7C, a temporary material 51 of the FFTI 41 is filled in the trench T1. Polysilicon (poly-Si) is filled as the temporary material 51, for example.

Figure 7D:
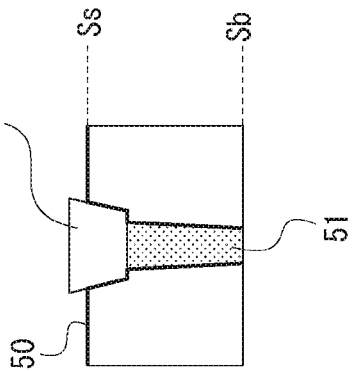
Figure 7E:
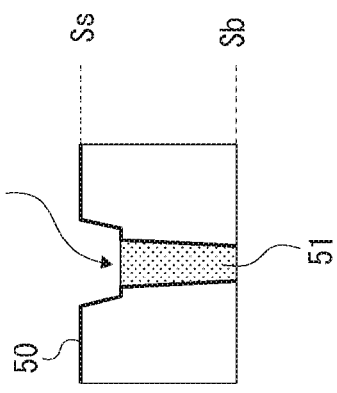

Next, as illustrated in FIG. 7D, in the formation position of the temporary material 51 (formation position of the FFTI 41), a trench T2 for the STI 40 is formed from the front surface Ss side.

Figure 7F:
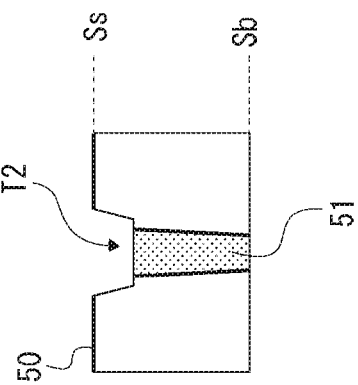
Figure 8A:
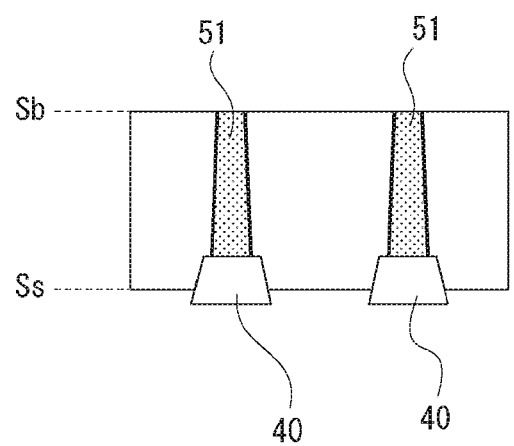
FIGS. 8A, 8B, 8C, and 8D are views for describing an outline of a back surface step among the steps of forming the STI and the FFTI.
Figure 8B:
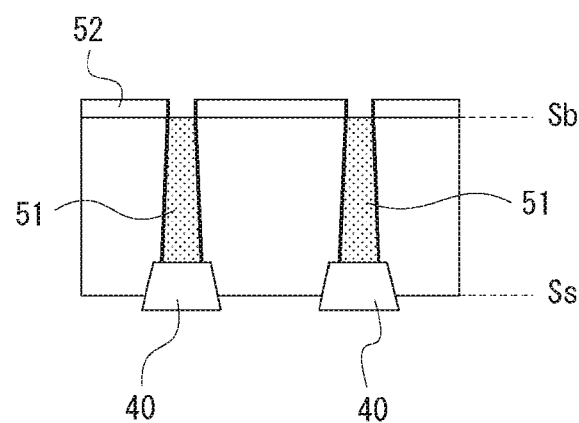
Figure 8C:
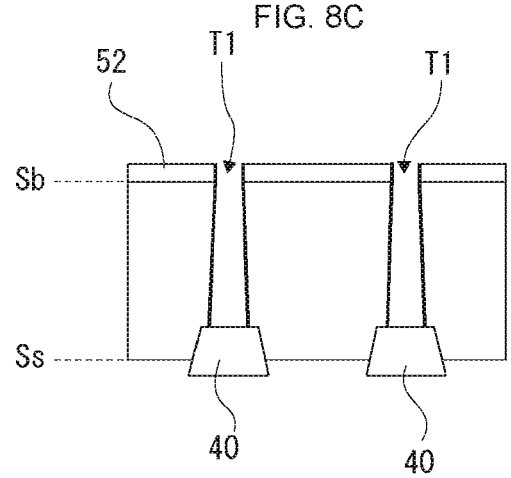
Figure 8D:
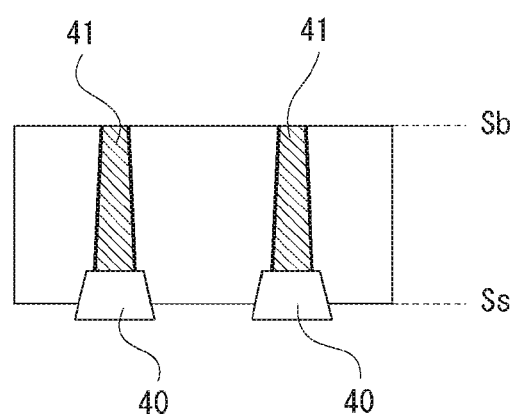

Moreover, the oxide film 50 is formed at the interface between the trench T2 and the semiconductor substrate by heat treatment and the like with respect to the semiconductor substrate (FIG. 7E), and a material for forming the STI 40 (in the present example, SiO$_2$) is filled in the trench T2 to form the STI 40 (FIG. 7F).

FIGS. 15A, 15B, 15C, 15D, and 15E is a are views for describing steps of forming the vertical gate electrode portion 32 for forming such a step shape of the opposite side wall portion 32b.

Figure 15:
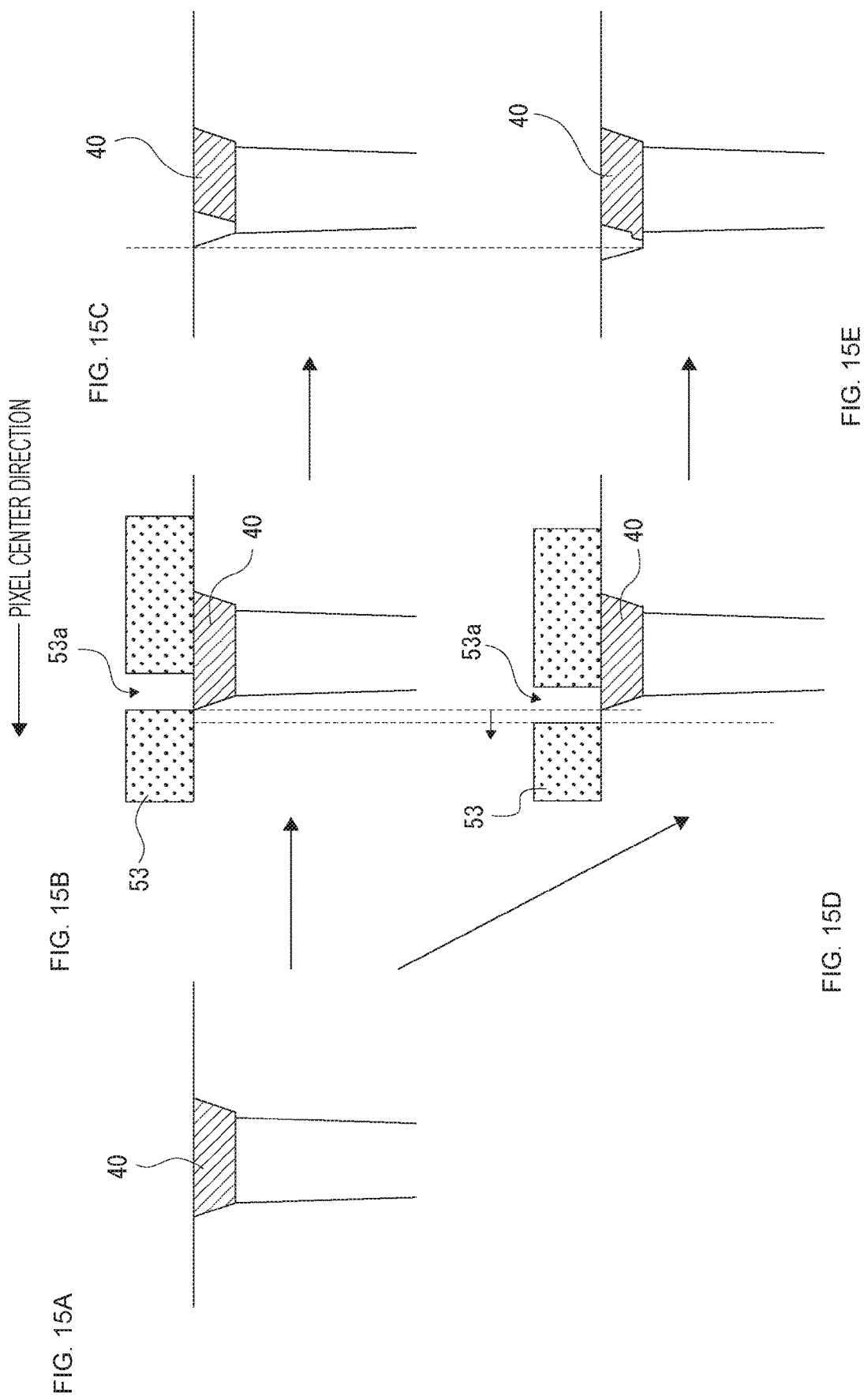
FIGS. 15A, 15B, 15C, 15D, and 15E are views for describing steps of forming a vertical gate electrode portion for forming a step shape of an opposite side wall portion in the third embodiment.

FIG. 15A schematically illustrates a state where the STI 40 and FFTI 41 are formed in the semiconductor substrate. From the state illustrated in FIG. 15A, the STI 40 is cut for forming the vertical gate electrode portion 32 by using a mask 53 in which an opening 53a for guiding the cutting position as illustrated in FIG. 15B is formed. Specifically, an end portion of the opening 53a on the pixel center side is aligned with an end portion of the STI 40 on the pixel center side, and the STI 40 is cut for forming the vertical gate electrode portion 32. Therefore, a groove portion for forming the vertical gate electrode portion 32 as illustrated in FIG. 15C is formed in the STI 40.

Here, the FFTI 41 is formed by the trench T1 obtained by cutting the semiconductor substrate from the front surface Ss side to the back surface Sb side as described above. At this time, the width of the trench T1 tends to gradually narrow toward a side in the progressing direction of cutting. For this reason, the FFTI 41 has a feature that the width thereof is narrower on the back surface Sb side than the front surface Ss side.

By using at least a portion of the oxide film of the opposite side wall portion 32b also as the oxide film of the STI 40, the oxide film forming step of the opposite side wall portion 32b can be merged with the step of forming the STI 40 as described above.

Figure 9:
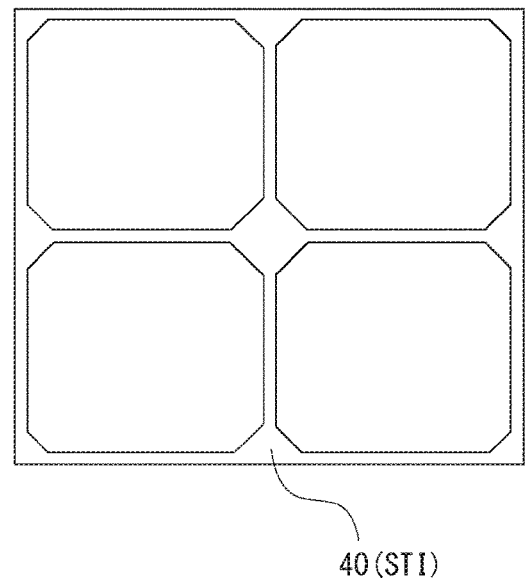
FIG. 9 is a view of the STI formed in the pixel in the first embodiment as viewed in a plan view.

FIG. 9 is a view of the STI 40 formed over inter-pixels as an inter-pixel separation structure as viewed in a plan view. Note that, in FIG. 9, the number of pixels Px is four for the sake of description.

As illustrated in the drawing, in the present example, the width of the STI 40 is made larger at intersection portions than other portions (portions other than the intersection portions of the STI 40) in a plan view.

Therefore, at least a portion of the oxide film of the opposite side wall portion 32b can also be used as the oxide film of the STI 40, according to the arrangement of the transfer transistors TG-A and TG-B illustrated in FIG. 4. By a simple method in which the width of the intersecting portions of the STI 40 is made larger, it is possible to reduce the side wall capacitance of the vertical gate electrode portion 32.

Figure 10:
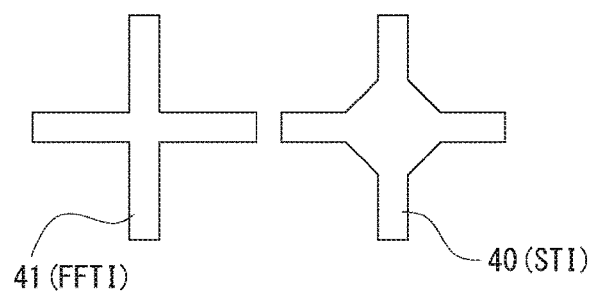
FIG. 10 is an explanatory view of an example of width setting of the FFTI.
Figure 11:
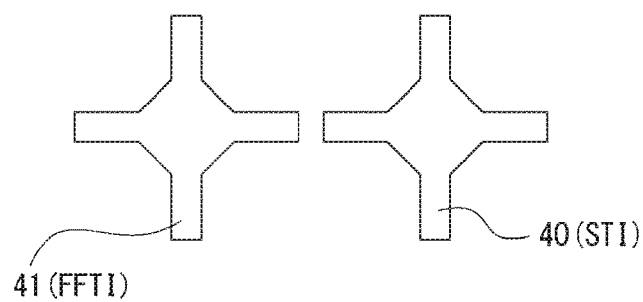
FIG. 11 is an explanatory view of another example of width setting of the FFTI.

Here, as illustrated in a schematic view in FIG. 10, the width of the FFTI 41 at intersection portions may not be made larger, or the width of the FFTI 41 at the intersection portions can be made larger than other portions as illustrated in the schematic view in FIG. 11, similarly to the STI 40.

By increasing the width of the intersection portions not only of the STI 40 but also of the FFTI 41, the frame strength (frame rigidity) of the pixel array unit 11 is improved.

2. Second Embodiment

Figure 12:
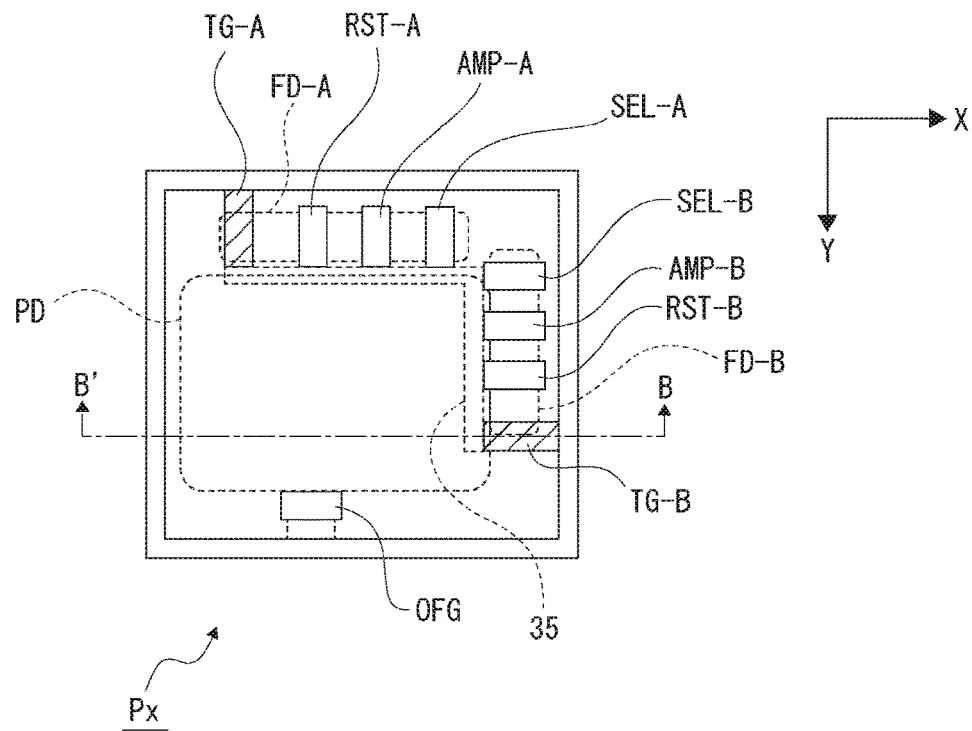
FIG. 12 is a plan view for describing a schematic structure of a pixel as a second embodiment.
Figure 13:
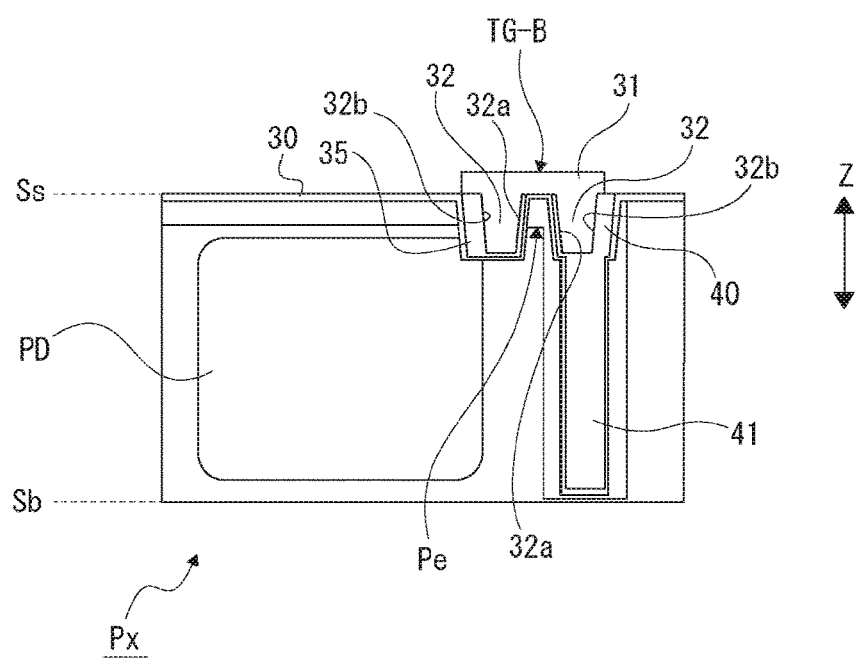
FIG. 13 is a cross-sectional view for describing a schematic structure of the pixel as the second embodiment.

FIGS. 12 and 13 are views for describing a schematic structure of the pixel Px as a second embodiment, and FIG. 12 is, similarly to FIG. 4 described previously, a plan view of the pixel Px observed from the front surface Ss side and FIG. 13 is a cross-sectional view illustrating a state of a cross section when the pixel Px is cut at a position of line B-B' illustrated in FIG. 12 in the Z direction.

Note that, in the following description, with respect to portions other than the transfer transistors TG, portions similar to the portions that have already been described are denoted by the same symbols, and the description thereof is omitted.

As illustrated in FIG. 12, unlike the case of FIG. 4, the transfer transistors TG-A and TG-B in this case are not arranged to have a diagonal relationship and the shape thereof in a plan view is rectangular. The transfer transistor TG-A is arranged at a position closer to the center in the X direction from the position of the transfer transistor TG-A in FIG. 4, and the transfer transistor TG-A, the reset transistor RST-A, the amplification transistor AMP-A, and the selection transistor SEL-A are arrayed in this order in the X direction.

The transfer transistor TG-B is arranged at a position closer to the center in the Y direction from the position of the transfer transistor TG-B in FIG. 4, and the transfer transistor TG-B, the reset transistor RST-B, the amplification transistor AMP-B, and the selection transistor SEL-B are arrayed in this order in the Y direction.

FIG. 13 illustrates a cross section of the transfer transistor TG-B, and the transfer transistors TG-A and TG-B in this case include two vertical gate electrode portions 32. One vertical gate electrode portion 32 is positioned closer to the outer periphery of the pixel Px, and the other vertical gate electrode portion 32 is positioned closer to the inner periphery of the pixel Px.

The transfer transistors TG-A and TG-B in this case transfer charges from the photodiode PD via a region between the two vertical gate electrode portions 32, which is indicated by an arrow Pe in FIG. 13. That is, the charge transfer path in this case is a path passing through the region between the two vertical gate electrode portions 32.

For this reason, in each vertical gate electrode portion 32, a side wall portion on a side facing the charge transfer path is the transfer side wall portion 32a, and a side wall portion positioned on a side opposite to the transfer side wall portion 32a is the opposite side wall portion 32b.

In the present example, with respect to the opposite side wall portion 32b of the vertical gate electrode portion 32 positioned on the outer peripheral side of the pixel Px among the two vertical gate electrode portion 32, at least a portion of the oxide film thereof is also used as the STI 40, which makes the oxide film thickness thereof larger than that of the transfer side wall portion 32a.

On the other hand, with respect to the opposite side wall portion 32b of the vertical gate electrode portion 32 positioned on the inner peripheral side, the oxide film thickness thereof is made larger than that of the transfer side wall portion 32a by forming an oxide film 35 as illustrated in the drawing.

In the present example, in a plan view illustrated in FIG. 12, the oxide film 35 is continuously formed along two sides, which are a side where the transfer transistor TG-B, the reset transistor RST-B, the amplification transistor AMP-B, and the selection transistor SEL-B are arrayed and a side where the transfer transistor TG-A, the reset transistor RST-A, the amplification transistor AMP-A, and the selection transistor SEL-A are arrayed, among the sides of the photodiode PD.

Note that the formation mode of the oxide film 35 is merely an example, and is not limited to this mode.

As described above, by adopting a structure in which charges are transferred via the region between the two vertical gate electrode portions 32, charge transfer efficiency is improved.

Note that an example in which the transfer transistors TG-A and TG-B are not arranged diagonally to the pixel Px has been described above with respect to the example including the two vertical gate electrode portions 32, but the transfer transistors TG-A and TG-B may be arranged diagonally as illustrated in FIG. 4. In this case, the oxide film of the opposite side wall portion 32b of the vertical gate electrode portion 32 positioned on the pixel inner peripheral side among the two vertical gate electrode portions 32 is formed by a step different from the step of forming the STI 40, and the oxide film thickness thereof is made larger than that of the transfer side wall portion 32a.

3. Third Embodiment

Figure 14:
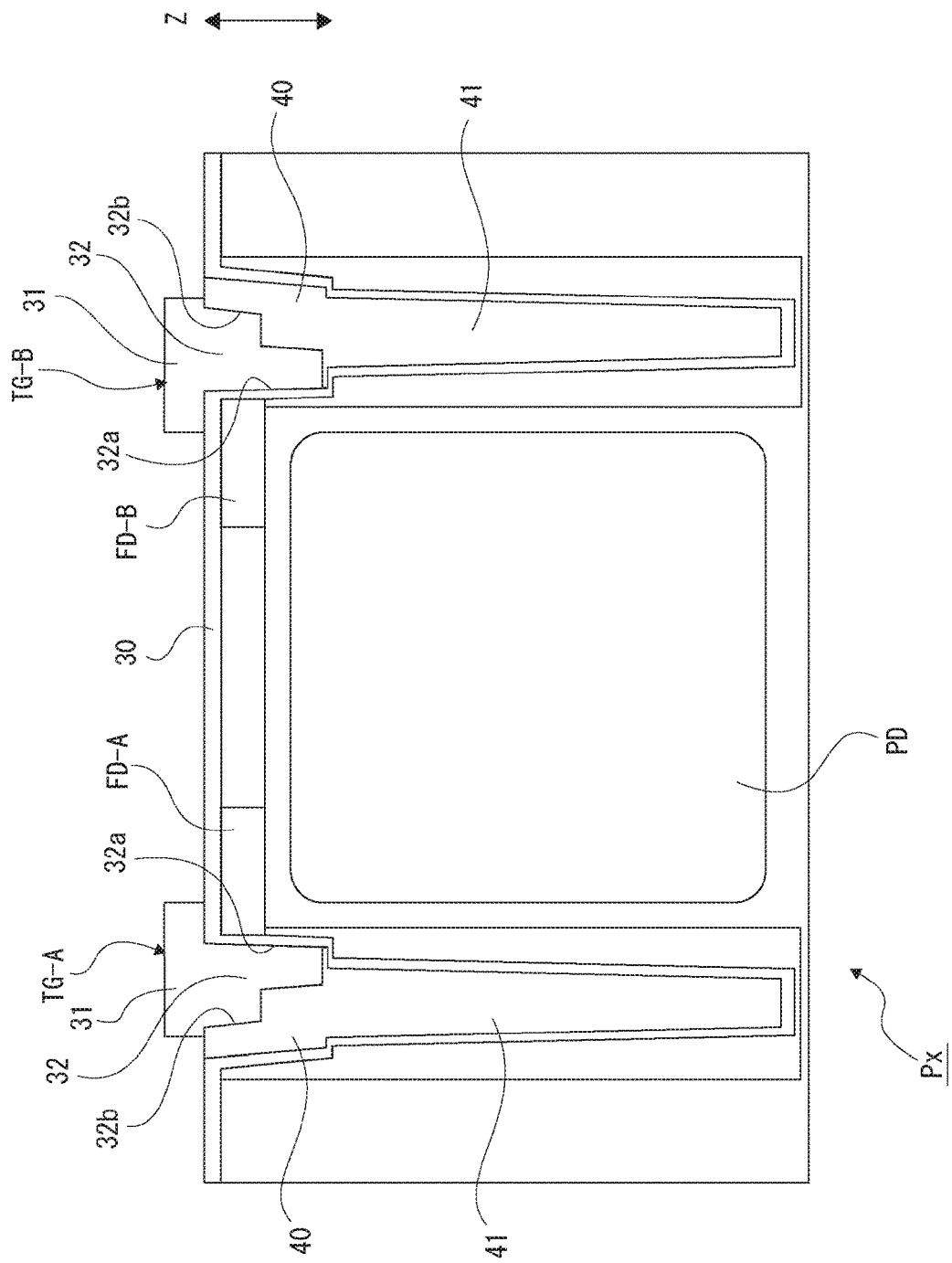
FIG. 14 is a cross-sectional view for describing a schematic structure of a pixel as a third embodiment.

FIG. 14 is a view for describing a schematic structure of the pixel Px as a third embodiment.

Here, in the third embodiment, it is assumed that the structure of the pixel Px in a plan view is similar to the pixel illustrated in FIG. 4 described previously. In FIG. 14, with respect to the pixel Px as the third embodiment, a state of a cross section when the pixel Px is cut along line A-A' illustrated in FIG. 4 is illustrated.

In the third embodiment, in each of the transfer transistors TG-A and TG-B, the opposite side wall portion 32b of the vertical gate electrode portion 32 has a step shape as illustrated in the drawing. Specifically, the opposite side wall portion 32b in this case has a step shape in which a distal end portion is offset toward the transfer side wall portion 32a side.

FIGS. 15A, 15B, 15C, 15D, and 15E is a are views for describing steps of forming the vertical gate electrode portion 32 for forming such a step shape of the opposite side wall portion 32b.

FIG. 15A schematically illustrates a state where the STI 40 and FFTI 41 are formed in the semiconductor substrate. From the state illustrated in FIG. 15A, the STI 40 is cut for forming the vertical gate electrode portion 32 by using a mask 53 in which an opening 53a for guiding the cutting position as illustrated in FIG. 15B is formed. Specifically, an end portion of the opening 53a on the pixel center side is aligned with an end portion of the STI 40 on the pixel center side, and the STI 40 is cut for forming the vertical gate electrode portion 32. Therefore, a groove portion for forming the vertical gate electrode portion 32 as illustrated in FIG. 15C is formed in the STI 40.

However, an error in formation position of the mask 53 may possibly occur in the step of forming the mask 53, and in a case where the mask 53 is shifted on a side opposite to the pixel center direction, the oxide film of the STI 40 remains after cutting, and the oxide film thickness of the transfer side wall portion 32a becomes larger than an ideal value.

For this reason, in the third embodiment, as illustrated in FIG. 15D, the mask 53 is formed closer to the pixel center side than in the case of FIG. 15B, and the STI 40 is cut for forming the vertical gate electrode portion 32. At this time, in cutting, the groove width tends to narrow toward a side in the progressing direction of cutting. Accordingly, as a result, the groove having a step shape in which the distal end portion is offset in the pixel center direction is formed as illustrated in FIG. 15E.

The step shape is reflected as the step shape of the opposite side wall portion 32b as illustrated in FIG. 14.

As understood from this point, by adopting the configuration including the vertical gate electrode portion 32 including the opposite side wall portion 32b having a step shape as illustrated in FIG. 14, it is possible to prevent the oxide film thickness of the transfer side wall portion 32a from increasing. Furthermore, according to the step shape illustrated in FIG. 14, a portion of the opposite side wall portion 32b is offset toward the transfer side wall portion 32a side. Accordingly, the oxide film thickness of the opposite side wall portion 32b can be increased accordingly.

In this manner, according to the third embodiment, it is possible to reduce the side wall capacitance of the vertical gate electrode portion 32 while improving charge transfer efficiency by preventing the oxide film thickness of the transfer side wall portion 32a from becoming excessively large.

4. Modifications 4-1. First Example

Note that the embodiment is not limited to the specific examples described above, and configurations as various modifications can be adopted.

Figure 16:
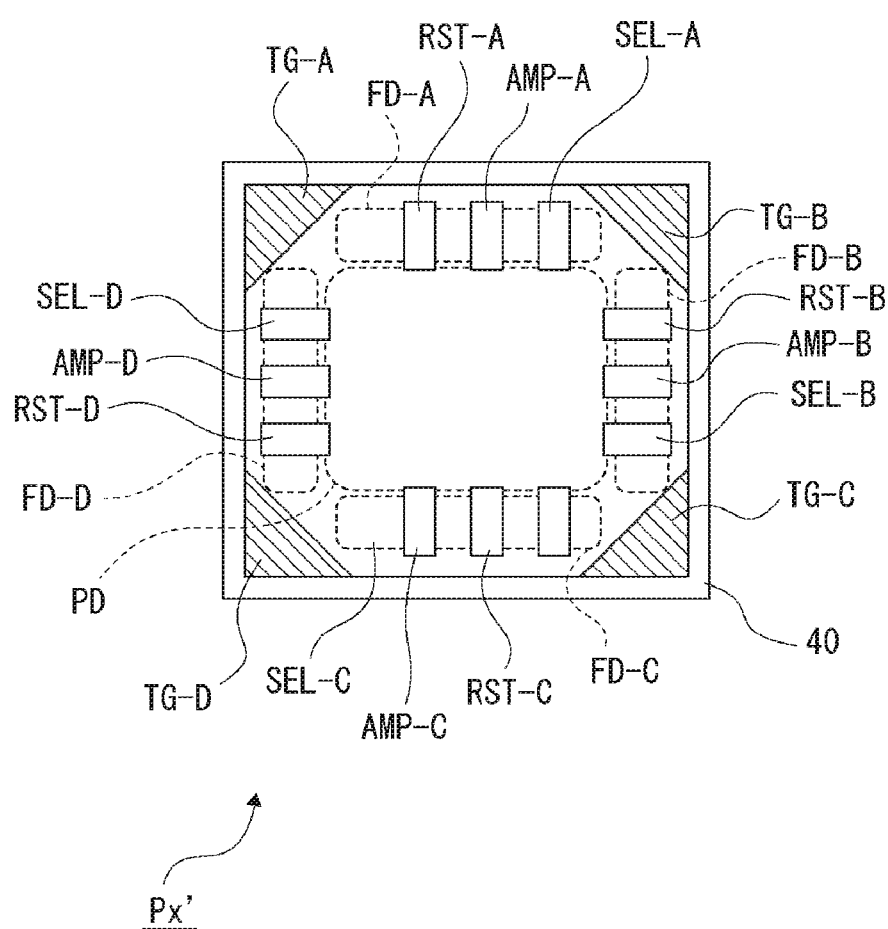
FIG. 16 is a plan view for describing a schematic structure of a pixel as a first modification.

FIG. 16 is a plan view for describing a schematic structure of a pixel Px' as a first modification.

The first modification is an application example to a 4TAP configuration. In the pixel Px' of the 4TAP, a total of four transfer transistors TG, that is, transfer transistors TG-C and TG-D in addition to the transfer transistors TG-A and TG-B, are provided as the transfer transistors TG.

The transfer transistor TG-C is provided with a floating diffusion FD-C, a reset transistor RST-C, an amplification transistor AMP-C, and a selection transistor SEL-C, and the transfer transistor TG-D is provided with a floating diffusion FD-D, a reset transistor RST-D, an amplification transistor AMP-D, and a selection transistor SEL-D.

In such a pixel Px' of the 4TAP, charges accumulated in the photodiode PD are distributed to the floating diffusions FD-A, FD-B, FD-C, and FD-D via the transfer transistors TG-A, TG-B, TG-C, and TG-D, respectively. The charges accumulated in the floating diffusions FD-A, FD-B, FD-C, and FD-D are, in response to the selection transistor SEL with the same alphabet at the end of the symbol among the selection transistors SEL-A, SEL-B, SEL-C, and SEL-D being set to be on, amplified by the amplification transistor AMP with the same alphabet at the end of the symbol among the amplification transistors AMP-A, AMP-B, AMP-C, and AMP-D, and are read out through the corresponding signal lines 22 (22-A, 22-B, 22-C, and 22-D), respectively.

4-2. Second Example

Figure 17:
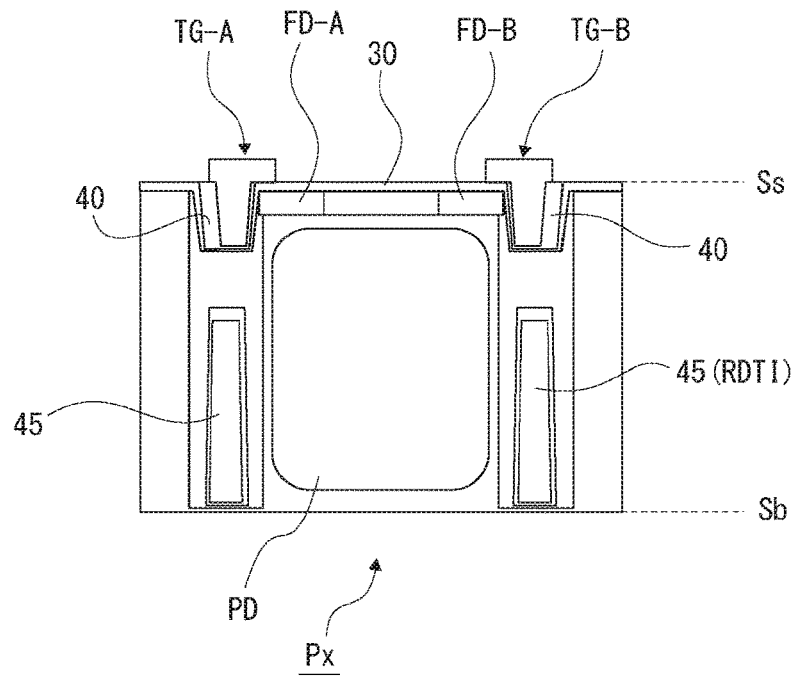
FIG. 17 is a cross-sectional view for describing a schematic structure of a pixel as a second modification.

FIG. 17 is a cross-sectional view for describing a schematic structure of the pixel Px as a second modification.

In the pixel Px as the second modification, a reversed deep trench isolation (RDTI) 45 is formed instead of the FFTI 41.

Similarly to the FFTI 41, the RDTI 45 has the optical prevention function and the electrical prevention function described above as the inter-pixel separation structure, but is formed by filling an insulating material in a trench formed by a cutting step from the back surface Sb side unlike the FFTI 41. Furthermore, the RDTI 45 does not involve forming the trench penetrating the substrate unlike the FFTI 41, and the distal end portion thereof on the front surface Ss side does not reach the STI 40.

Note that the RDTI 45 can include, for example, an oxide film such as $SiO_2$.

Since a trench is formed by cutting from the back surface Sb side toward the front surface Ss side, the RDTI 45 has a feature that the width thereof is narrower on the front surface Ss side than that on the back surface Sb side as illustrated in the drawing.

[4-3. Other Modifications]

In the above description, an example has been described in which the STI 40 includes $SiO_2$, but the STI 40 may include a low-k material. As the low-k material, for example, a material such as SiOF obtained by adding fluorine to $SiO_2$ can be maned.

Since the STI 40 includes the low-k material, at least a portion of the oxide film of the opposite side wall portion 32b includes the low-k material. Accordingly, it is possible to further reduce the side wall capacitance of the vertical gate electrode portion 32.

Furthermore, in the above description, an example has been described in which the FFTI 41 includes $SiO_2$, but the FFTI 41 may include polysilicon.

Therefore, in the process of forming the FFTI 41 (see FIGS. 7A, 7B, 7C, 7D, 7E, 7F, 8A, 8B, 8C, and 8D), a step of removing polysilicon filled in the trench and a step of filling another material (in the present example, $SiO_2$) in the trench after removal of polysilicon can be made unnecessary.

Therefore, it is possible to improve the efficiency of the manufacturing process of the sensor unit 1, so that the manufacturing cost of the sensor unit 1 can be reduced.

Furthermore, the shape of the transfer transistor TG is not limited to the specific examples described above.

Figure 18:
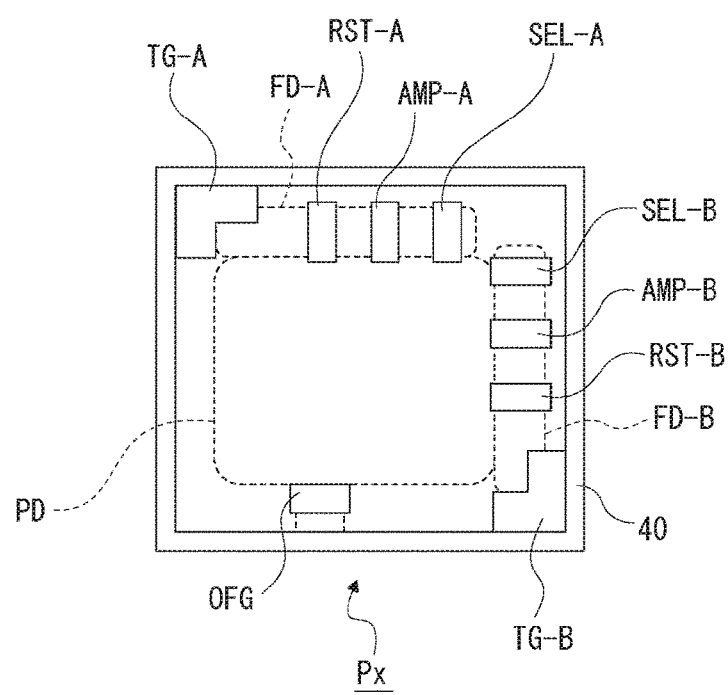
FIG. 18 is a plan view for describing a modification of the shape of a transfer transistor.
Figure 19:
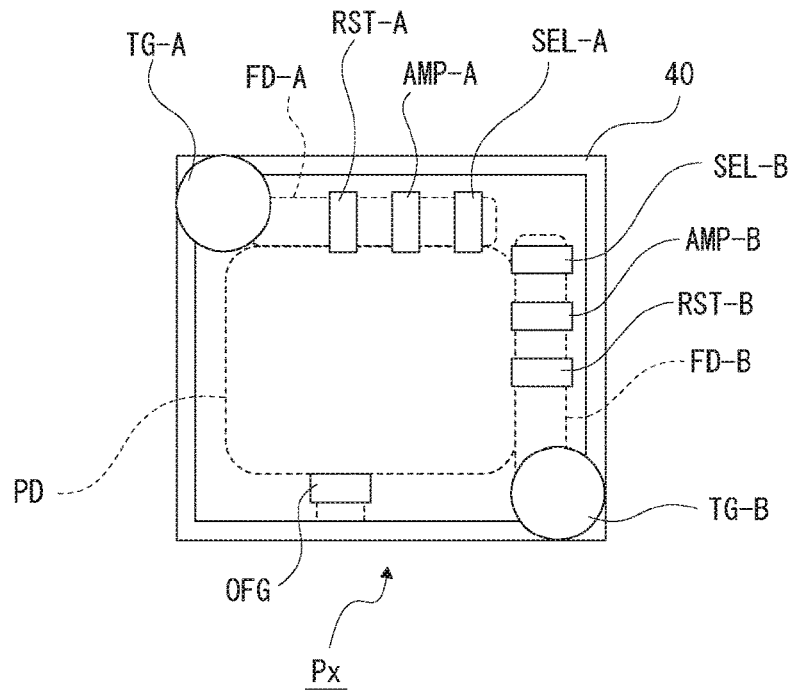
FIG. 19 is a plan view for describing another modification of the shape of the transfer transistor.

For example, an L shape illustrated in a plan view in FIG. 18, or a circular shape as illustrated in a plan view in FIG. 19 can be conceivable.

It is conceivable that the transfer transistors TG-A and TG-B having an L shape are arranged at corner portions having a diagonal relationship in the Pixel Px as in the example in FIG. 18. In this case, the transfer side wall portion 32a is formed on a side positioned on the inner peripheral side of the pixel Px among the two sides of the L shape of the transfer transistors TG-A and TG-B.

FIG. 19 illustrates an example in which the transfer transistors TG-A and TG-B having a circular shape are arranged at corner portions having a diagonal relationship in the pixel Px, but the arrangement position is not limited thereto.

Figure 20:
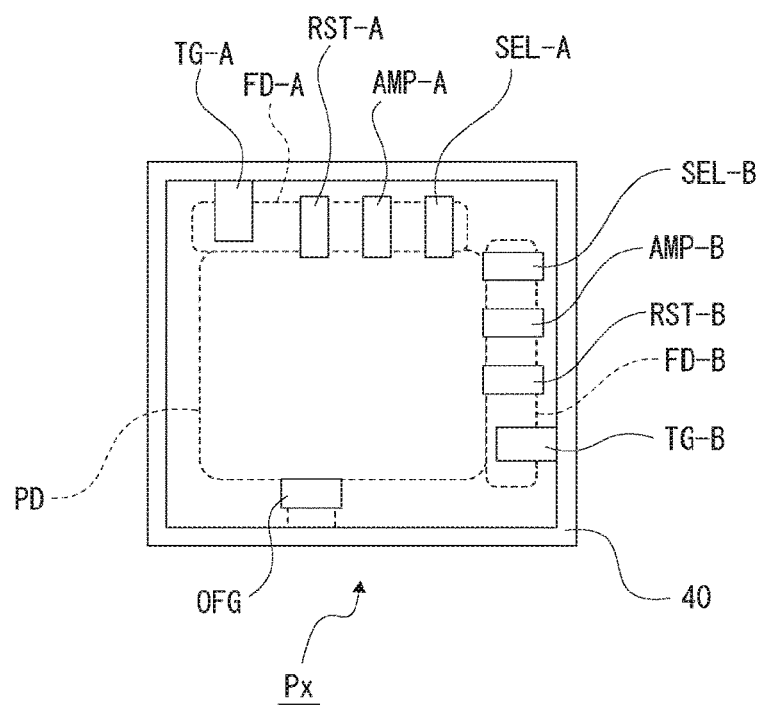
FIG. 20 is a plan view for describing a modification of arrangement of the transfer transistor.

The plan view in FIG. 20 illustrates an arrangement of the transfer transistors TG-A and TG-B similar to that in FIG. 12 described previously.

FIG. 12 illustrates an arrangement example of the transfer transistors TG-A and TG-B in a case where two gate electrode portions 32 are provided, but such an arrangement is also applicable to the configuration in which one vertical gate electrode portion 32 is provided. In this case, the formation of the oxide film 35 described in FIGS. 12 and 13 is unnecessary.

In the above description, the configuration is exemplified in which charges in the photodiode PD are transferred to the floating diffusions FD via the transfer transistors TG, but a configuration in which charges in the photodiode PD are transferred to a memory element via the transfer transistors TG, and thereafter, the charges accumulated in the memory element is transferred to the floating diffusions FD via another transfer transistors can be adopted as a configuration supporting global reading, for example. Note that, in this case, the memory element described above can be said to be a charge holding unit that holds charges accumulated in the photoelectric conversion element.

Furthermore, in the above description, an example has been described in which the sensor unit 1 performs sensing for distance measurement by the indirect ToF method, but the present technology can be widely and suitably applied to a sensor device including a pixel that includes a first charge holding unit and a second charge holding unit that hold charges accumulated in a photoelectric conversion element, a first transfer transistor using a vertical transistor that transfers the charges to the first charge holding unit, and a second transfer transistor using a vertical transistor that transfers the charges to the second charge holding unit.

<5. Summary of Embodiments>

As described heretofore, a sensor device (sensor unit 1) as an embodiment is a sensor device including a pixel (the same Px, Px') that includes: a photoelectric conversion element (photodiode PD) that performs photoelectric conversion; a first charge holding unit and a second charge holding unit (floating diffusions FD-A and FD-B, for example) that hold charges accumulated in the photoelectric conversion element; a first transfer transistor (transfer transistor TG-A, for example) that transfers the charges to the first charge holding unit; and a second transfer transistor (transfer transistor TG-B, for example) that transfers the charges to the second charge holding unit, in which the first and second transfer transistors each include a vertical transistor including a vertical gate electrode portion (the same 32), and in each of the first and second transfer transistors, an oxide film thickness of an opposite side wall portion (the same 32b) is made larger than an oxide film thickness of a transfer side wall portion, the opposite side wall portion (the same 32b) being positioned on a side opposite to the transfer side wall portion (the same 32a) that is a wall portion on a side facing a transfer path of the charges among side wall portions of the vertical gate electrode portion.

In the transfer transistor using the vertical transistor, the oxide film thickness of the opposite side wall portion is made larger than the oxide film thickness of the transfer side wall portion as described above. Accordingly, it is possible to reduce the side wall capacitance of the vertical gate electrode portion by increasing the oxide film thickness of the opposite side wall portion while making the thickness of the gate oxide film of the transfer side wall portion contributing to charge transfer a film thickness suitable for charge transfer.

By reducing the side wall capacitance of the vertical gate electrode portion, a high-speed switching operation of the transfer transistors becomes possible, so that it is possible to increase the speed of the charge distribution operation.

Furthermore, since a potential can be applied to a deep portion, it is possible to reduce the drive voltage of the transfer transistors, so that power of the sensor device can be saved.

Furthermore, the sensor device as the embodiment further includes a plurality of pixels each being the pixel, and at least a portion of an oxide film of the opposite side wall portion is also used as an oxide film for inter-pixel separation.

Therefore, an oxide film forming step of the opposite side wall portion can be merged with an oxide film forming step for inter-pixel separation.

Therefore, in reducing the side wall capacitance of the vertical gate electrode portion, it is possible to improve the efficiency of the manufacturing process of the sensor device, so that the manufacturing cost of the sensor device can be reduced.

Moreover, in the sensor device as the embodiment, at least a portion of the oxide film of the opposite side wall portion is also used as a shallow trench isolation (STI 40).

Therefore, the oxide film forming step of the opposite side wall portion can be merged with a step of forming the shallow trench isolation for inter-pixel separation.

Therefore, in reducing the side wall capacitance of the vertical gate electrode portion, it is possible to improve the efficiency of the manufacturing process of the sensor device, so that the manufacturing cost of the sensor device can be reduced.

Furthermore, in the sensor device as the embodiment, the first and second transfer transistors are arranged at corner portions having a diagonal relationship in the pixel of a rectangular shape.

Therefore, it is possible to realize a structure in which the oxide film thickness of the opposite side wall portion is made larger than that of the transfer side wall portion by a simple method in which the width of an intersecting portion of the shallow trench isolation is made larger.

Therefore, in reducing the side wall capacitance of the vertical gate electrode portion, it is possible to prevent the manufacturing process of the sensor device from becoming complicated, so that it is possible to improve the manufacturing efficiency of the sensor device, and thereby reducing the manufacturing cost.

Furthermore, the sensor device as the embodiment further includes a front full trench isolation (FFTI 41) as a structure for inter-pixel separation, and each of the shallow trench isolation and the front full trench isolation has a width at an intersection portion made larger than other portions.

By increasing the width of the intersection portion not only of the shallow trench isolation but also of the front full trench isolation, the frame strength (frame rigidity) of the pixel array unit is improved.

Therefore, the rigidity of the sensor device can be increased.

Moreover, in the sensor device as the embodiment, the first and second transfer transistors each include two vertical gate electrode portions each being the vertical gate electrode portion, and transfer the charges via a region between the two vertical gate electrode portions.

By adopting a structure in which the charges are transferred via the region between the two vertical gate electrode portions, charge transfer efficiency is improved.

Therefore, it is possible to reduce the drive voltage of the transfer transistors, so that power of the sensor device can be saved. Furthermore, also in this case, since the oxide film thickness of the opposite side wall portion is made larger, the side wall capacitance is reduced, so that the distribution speed can be increased.

Furthermore, in the sensor device as the embodiment, in the first and second transfer transistors, the opposite side wall portion has a step shape in which a distal end portion is offset toward a transfer side wall portion side.

Therefore, it is possible to increase the oxide film thickness of the opposite side wall portion while preventing the oxide film thickness of the transfer side wall portion from increasing in a step of forming the vertical transistor.

Therefore, it is possible to reduce the side wall capacitance of the vertical gate electrode portion, that is, to increase the speed of the charge distribution operation while improving the charge transfer efficiency.

Furthermore, the sensor device as the embodiment further includes: a plurality of pixels each being the pixel; and a shallow trench isolation and a front full trench isolation as structures for inter-pixel separation, and the front full trench isolation includes polysilicon.

Therefore, in a process of forming the front full trench isolation, a step of removing polysilicon filled in a trench and a step of filling another material in the trench after removal of polysilicon can be made unnecessary.

Therefore, it is possible to improve the efficiency of the manufacturing process of the sensor device, so that the manufacturing cost of the sensor device can be reduced.

Moreover, in the sensor device as the embodiment, the shallow trench isolation includes a low-k material.

Therefore, at least a portion of the oxide film of the opposite side wall portion includes the low-k material.

Therefore, it is possible to further reduce the side wall capacitance of the vertical gate electrode portion, so that the speed of the charge distribution operation can be further increased.

Furthermore, the sensor device as the embodiment further includes: a plurality of pixels each being the pixel; and a reversed deep trench isolation as a structure for inter-pixel separation.

Therefore, the side wall capacitance of the vertical gate electrode portion is reduced for supporting a case where the reversed deep trench isolation is adopted as a structure for inter-pixel separation. Accordingly, a high-speed switching operation of the transfer transistors becomes possible, so that it is possible to increase the speed of the charge distribution operation.

Note that the advantageous effects described in the present specification are merely examples and are not limited, and other advantageous effects may be provided.

<6. Present technology>

Note that the present technology can also adopt the following configurations.

(1)

A sensor device including a pixel that includes:
a photoelectric conversion element that performs photoelectric conversion;
a first charge holding unit and a second charge holding unit that hold charges accumulated in the photoelectric conversion element;
a first transfer transistor that transfers the charges to the first charge holding unit; and
a second transfer transistor that transfers the charges to the second charge holding unit,
in which each of the first and second transfer transistors includes a vertical transistor including a vertical gate electrode portion, and
in each of the first and second transfer transistors, an oxide film thickness of an opposite side wall portion is made larger than an oxide film thickness of a transfer side wall portion, the opposite side wall portion being positioned on a side opposite to the transfer side wall portion that is a wall portion on a side facing a transfer path of the charges among side wall portions of the vertical gate electrode portion.

(2)

The sensor device according to the (1), further including a plurality of pixels each being the pixel,
in which at least a portion of an oxide film of the opposite side wall portion is also used as an oxide film for inter-pixel separation.

(3)

The sensor device according to the (2),
in which at least a portion of the oxide film of the opposite side wall portion is also used as a shallow trench isolation.

(4)

The sensor device according to the (3),
in which the first and second transfer transistors are arranged at corner portions having a diagonal relationship in the pixel of a rectangular shape.

(5)

The sensor device according to the (4), further including a front full trench isolation as a structure for inter-pixel separation,
in which each of the shallow trench isolation and the front full trench isolation has a width at an intersection portion made larger than other portions.

(6)

The sensor device according to any one of the (1) to (5),
in which the first and second transfer transistors each include two vertical gate electrode portions each being the vertical gate electrode portion, and transfer the charges via a region between the two vertical gate electrode portions.

(7)

The sensor device according to any one of the (1) to (6),
in which, in the first and second transfer transistors, the opposite side wall portion has a step shape in which a distal end portion is offset toward a transfer side wall portion side.

(8)

The sensor device according to any one of the (1) to (7), further including:
a plurality of pixels each being the pixel; and
a shallow trench isolation and a front full trench isolation as structures for inter-pixel separation,
in which the front full trench isolation includes polysilicon.

(9)

The sensor device according to any one of the (3) to (8),
in which the shallow trench isolation includes a low-k material.

(10)

The sensor device according to any one of the (1) to (4), further including:
a plurality of pixels each being the pixel; and
a reversed deep trench isolation as a structure for inter-pixel separation.

REFERENCE SIGNS LIST

Px, Px' Pixel
PD Photodiode
OFG OF gate transistor
FD Floating diffusion
TG Transfer transistor
RST Reset transistor
AMP Amplification transistor
SEL Selection transistor
Ss Front surface
Sb Back surface
DeA, DeB Charge transfer path
30 Insulating film
31 Planar gate electrode portion
32 vertical gate electrode portion
32a Transfer side wall portion
32b Opposite side wall portion
35 Oxide film
40 Shallow trench isolation (STI)
41 Front full trench isolation (FFTI)
45 Reversed deep trench isolation (RDTI)
T1, T2 Trench
50 Oxide film
51 Temporary material

The invention claimed is:

1. A sensor device comprising a pixel that includes:
a photoelectric conversion element configured to perform photoelectric conversion;
a first charge holding unit and a second charge holding unit configured to hold charges accumulated in the photoelectric conversion element;
a first transfer transistor configured to transfer the charges to the first charge holding unit; and
a second transfer transistor configured to transfer the charges to the second charge holding unit,
wherein each of the first and second transfer transistors includes a vertical transistor including a vertical gate electrode portion, and
in each of the first and second transfer transistors, an oxide film thickness of an opposite side wall portion is made larger than an oxide film thickness of a transfer side wall portion, the opposite side wall portion is on a side opposite to the transfer side wall portion that is a wall portion on a side facing a transfer path of the charges among side wall portions of the vertical gate electrode portion.

2. The sensor device according to claim 1, further comprising
a plurality of pixels comprising the pixel,
wherein at least a portion of an oxide film of the opposite side wall portion is also used as an oxide film for inter-pixel separation.

3. The sensor device according to claim 2,
wherein at least a portion of the oxide film of the opposite side wall portion is also used as a shallow trench isolation.

4. The sensor device according to claim 3,
wherein the first and second transfer transistors are at corner portions having a diagonal relationship in the pixel of a rectangular shape.

5. The sensor device according to claim 4, further comprising:
a front full trench isolation as a structure for inter-pixel separation,
wherein each of the shallow trench isolation and the front full trench isolation has a width at an intersection portion made larger than other portions.

6. The sensor device according to claim 1,
wherein the first and second transfer transistors each include two vertical gate electrode portions each being the vertical gate electrode portion, and transfer the charges via a region between the two vertical gate electrode portions.

7. The sensor device according to claim 1,
wherein, in the first and second transfer transistors, the opposite side wall portion has a step shape in which a distal end portion is offset toward a transfer side wall portion side.

8. The sensor device according to claim 1, further comprising:
a plurality of pixels comprising the pixel; and
a shallow trench isolation and a front full trench isolation as structures for inter-pixel separation,
wherein the front full trench isolation includes polysilicon.

9. The sensor device according to claim 3,
wherein the shallow trench isolation includes a low-k material.

10. The sensor device according to claim 1, further comprising:
a plurality of pixels comprising the pixel; and
a reversed deep trench isolation as a structure for inter-pixel separation.

* * * * *